United States Patent

Walba

(10) Patent No.: US 8,963,140 B2
(45) Date of Patent: Feb. 24, 2015

(54) ORGANIC PHOTOVOTAICS

(71) Applicant: The Regents of the University of Colorado, Denver, CO (US)

(72) Inventor: David M. Walba, Boulder, CO (US)

(73) Assignee: The Regents of the University of Colorado, Denver, CO (US)

( * ) Notice: Subject to any disclaimer, the term of this patent is extended or adjusted under 35 U.S.C. 154(b) by 188 days.

(21) Appl. No.: 13/764,660

(22) Filed: Feb. 11, 2013

(65) Prior Publication Data

US 2013/0207090 A1    Aug. 15, 2013

Related U.S. Application Data

(60) Provisional application No. 61/597,273, filed on Feb. 10, 2012.

(51) Int. Cl.
*H01L 35/24* (2006.01)

(52) U.S. Cl.
USPC .................................... 257/40; 257/E51.001

(58) Field of Classification Search
USPC ........................................... 257/40, E51.001
See application file for complete search history.

(56) References Cited

PUBLICATIONS

Admiraal, S. J.; Herschlag, D. "The substrate-assisted general base catalysis model for phosphate monoester hydrolysis: Evaluation using reactivity comparisons," J. Am. Chem. Soc. 2000, 122, (10), 2145-2148.

Akutagawa, et al., Mesomorphic behavior of 1,3-phenylene bis[4-(4-alkoxyphenyliminomethyl)benzoates and related compounds, K. Liq. Cryst. 1994, 17, 659-666.

Allen, et al., Molecular-dynamics simulation of the smectic-A* twist grain-boundary phase, Phys. Rev. E, 1998, 57, 5585-5596.

Araoka, et al., H. "Twist-grain-boundary structure in the B4 phase of a bent-core molecular system identified by second harmonic generation circular dichroism measurement," Phys. Rev. Lett. 2005, 94, (13).

Araoka, et al., "Spectral blue shift via intermolecular interactions in the B2 and B4 phases of a bent-shaped molecule," Phys. Rev. E, 2010, 82, (4).

Attard, et al., Non-symmetric dimeric liquid crystals the preparation and properties of the α-(4-cyanobiphenyl-4'-yloxy)-ω-(4-n-alkylanilinebenzylidene-4'-oxy)alkanes, L. Liq. Cryst. 1994, 16, 529-581.

Bergersen, et al., Equilibrium configurations of particles on a sphere: the case of logarithmic interactions, Phys. A: Math. Gen. 1994, 27, 2579-2586.

Bialecka-Florjanczyk, E., et al., "Odd-even effect in biphenyl-based symmetrical dimers with methylene spacer—evidence of the B4 phase," Liq. Cryst. 2008, 35, (4), 401-406.

Brand, et al., Symmetry and Defects in the CM Phase of Polymeric Liquid Crystals, Macromolecules 1992, 25, 7223-7226.

Brown et al, "Charge carrier generation and exciton quenching at M3EH-small molecule and M3EH-PPV/oxide interfaces," IEEE, (2000), pp. 1186-1189.

Bustamante, et al., Antiferroelectric achiral mesogenic polymer, Chem. Phys. Lett. 1996, 260, 447-452.

(Continued)

*Primary Examiner* — Anthony Ho
(74) *Attorney, Agent, or Firm* — Lathrop & Gage LLP

(57) ABSTRACT

The present disclosure is for improved organic semiconductors and improved organic photovoltaics. Liquid crystalline bent-core molecules in the B4 subphase of the present disclosure may be incorporated into improved organic semiconductors. Liquid crystalline bent-core molecules in the B4 subphase of the present disclosure may be incorporated into improved organic photovoltaics that may have improved quantum efficiencies over pre-existing organic photovoltaics.

19 Claims, 10 Drawing Sheets

(56) References Cited

PUBLICATIONS

Bustamante, et al., Antiferroelectric behavior of achiral mesogenic polymer mixtures, W. Liq. Cryst. 1996, 21, 829-839.

Chandani, et al., Antiferroelectric Chiral Smectic Phases Responsible for the Tristable Switching in MHPOBC, Jpn. J. Appl. Phys. 1989, 28, L1265-L1268.

Chen, et al., "Pre-transitional orientational ordering of calamitic by helical nanofilaments of bent-core liquid crystal," Langmuir, 26, (19), 15541-15545, (2010).

Choi, et al., "Intrinsic chirality in a bent-core mesogen induced by extrinsic chiral structures," Angew. Chem. Int. Ed., 45, (39), 6503-6506, (2006).

Choi, et al., "Vibrational circular dichroism spectroscopic study on circularly polarized light-induced chiral domains in the B4 phase of a bent mesogen," Chemistry Letters, 36, (8), 1018-1019, (2007).

Choi, et al., "Second-harmonic generation in achiral bent-shaped liquid crystals," Jpn. J. Appl. Phys. Pt 1, 37, (6A), 3408-3411, (1998).

Choi, et al., "Structure and switching in bent-shaped molecular liquid crystal systems with two mesogenic groups linked by alkylene spacer," Mol. Cryst. Liq. Cryst. Sci. Technol., Sect. A, 328, 185-192, (1999).

Cladis, et al., Electrooptic response of smectic O and smectic O Liq. Cryst., 14, 1327-1349, (1993).

Clark, N. A.; Lagerwall, Submicrosecond bistable electrooptic switching in liquid crystals, S. T. Appl. Phys. Lett., 36, 899-901, (1980).

Coleman, D. A.; Jones, C. D.; Nakata, M.; Clark, N. A.; Walba, D. M.; Weissflog, W.; Fodor-Csorba, K.; Watanabe, J.; Novotna, V.; Hamplova, V. Phys. Rev. E, 77, 021703, (2008).

Cotter, et al., Ferroelectric-liquid-crystal/silicon-integrated-circuit spatial light modulator, Opt. Lett., 15, 291-293, (1990).

Cram, D. J., The Design of Molecular Hosts, Guests, and Their Complexes, Science, 240, 760-767, (1988).

De Luca, G.; Liscio, A.; Melucci, M.; Schnitzler, T.; Pisula, W.; Clark, C. G.; Scolaro, L. M.; Palermo, V.; Mullen, K.; Samori, P. "Phase separation and affinity between a fluorinated perylene diimide dye and an alkyl-substituted hexa-peri-hexabenzocoronene," J. Mater. Chem., 20, (1), 71-82, (2010).

Demus, et al., Handbook of Liquid Crystals, Wiley VCH: Weinheim, (1998).

Drzaic, P. S., Liquid Crystal Dispersions, World Scientific Publishing Co., Ong Editor, Kopin Corporation, River Edge, NJ, (1995).

Ebert, et al., Sanidics: A new class of mesophases, displayed by highly substituted rigid-rod polyesters and polyamides P., Liq. Cryst., 7, 63-79, (1990).

Feringa, et al., Chiroptical Switching between Liquid Crystalline Phases, J. Am. Chem. Soc., 117, 9929-9930, (1995).

Frommer, J. E., Conducting Polymer Solutions, Acc. Chem. Res., (1986), 19, 2-9.

Funahashi, M.; Hanna, J., Anomalous high carrier mobility in smectic E phase of a 2-phenylnaphthalene derivative, Appl. Phys. Lett., 73, 3733-3735, (1998).

Funahashi, M.; Hanna, High ambipolar carrier mobility in self-organizing terthiophene derivative, J. Appl. Phys. Lett., 76, 2574-2576, (2000).

Funahashi, M.; Hanna, J. I., High Carrier Mobility up to 0.1 $cm^2V^{-1}s^{-1}$ at Ambient Temperatures in Thiophene-Based Smectic Liquid Crystals, Adv. Mater., 17, 594-598, (2005).

Funahashi, M.; Hanna, Fast Hole Transport in a New Calamitic Liquid Crystal of 2-(4'-Heptyloxyphenyl)-6-Dodecylthiobenzothiazole, J. Phys. Rev. Lett., 78, 2184-2187, (1997).

Gregg, "Bilayer molecular solar cells in spin-coated TiO2 substrates," Chemical Physics Letters, vol. 258, pp. 376-370, (1996).

Gregg, "Excitonic Solar Cells," J. Phys. Chem. B, vol. 107, 4688-4698, (2003).

Gregg, et al., "Photovoltaic effect in symmetrical cells of a liquid-crystal porphyrin," Journal of Physical Chemistry, 94, (4), 1586-1598, (1990).

Heppke, G.; Moro, D. "Chiral Order from Achiral Molecules," Science, 279, (5358), 1872-1873, (1998).

Heppke, G.; Parghi, D. D.; Sawade, H. "Novel sulphur-containing banana-shaped liquid crystal molecules," Liq. Cryst. 2000, 27, (3), 313-320.

Heppke, G, et al., Electric-field-induced chiral separation in liquid crystals, Phys. Rev. Lett., 86, 5715-5718, (2001).

Hough, et al., M. A. Glaser, and N. A. Clark, Chiral Isotropic Liquids from Achiral Molecules Science,325 (5939), 452-456, Jul. 24, 2009.

Hough, et al., "Helical nanofilament phases," Science, 325, (5939), 456-460, (2009).

Hough, et al.,"Freeze Fracture and AFM Studies of the Liquid Crystal Dark Conglomerate and B4 Phases," Bull. Am. Phys. Soc., 50, 223, (2005).

Jacobson, M. Z., Review of solutions to global warming, air pollution, and energy security, Energy Environ. Sci., 2, pp. 148-173, (2009).

Keith, C., et al., "The carbosilane unit as a stable building block for liquid crystal design: a new class of ferroelectric switching banana-shaped mesogens," Chem. Commun., (17), 1898-1899, (2004).

Keller, et al., Evidence for the "zigzag" model of the smectic-C phase in the liquid crystal 4'-butoxyphenylester 4-decyloxybenzoic acid (4OP1008): A high-resolution x-ray study. Phys. Rev. A, 34, 4363-4369, (1986).

Kresse, H.; Schmalfuss, H.; Weissflog, W.; Tschierske, C.; Hauser, A. "Dielectric characterization of B-n phases," Mol. Cryst. Liquid Cryst., 366, 2357-2369, (2001).

Kuboshita, M., et al., Mesomorphic Behavior of Compounds Incorporating One-Unit Linking Groups, Molecular Crystals and Liquid Crystals, Science and Technology. Section A., T. Mol. Cryst. Liq. Cryst. A, 264, pp. 145-153, (1995).

Kurosu, H.; Kawasaki, M.; Hirose, M.; Yamada, M.; Kang, S.; Thisayukta, J.; Sone, M.; Takezoe, H.; Watanabe, J. "Solid-State 13C NMR Study of Chiral Twisted Conformation Attributable to Chirality in Smectic Phases of Achiral Banana-Shaped Molecules," J. Phys. Chem. A, 108, (21), pp. 4674-4678, (2004).

Lee, C. K.; Chien, L. C., First observation of double-twisted helical structure in a banana-shaped achiral molecule, Liq. Cryst., 26, 609-612, (1999).

Lee, et al., "Odd-even behavior of ferroelectricity and antiferroelectricity in two homologous series of bent-core mesogens," J. Am. Chem. Soc., 127, (31), 11085-11091, (2005).

Lee, S. K.; Li, X. D.; Kang, S. M.; Tokita, M.; Watanabe, J. "Formation of banana phases in bent-shaped molecules with unusual bent angles as low as 60 degrees," J. Mater. Chem. 2009, 19, (26), 4517-4522.

Lehn, J. M., Perspectives in Supramolecular Chemistry—From Molecular Recognition towards Molecular Information Processing and Self-organization, Angew. Chem., Int. Ed. Engl., 29, 1304-1319, (1990).

Lemieux, R.P, Chirality Transfer in Ferroelectric Liquid Crystals, Acc. Chem. Res., 341, 845-853 (2001).

Li, X. D.; Kang, S. M.; Lee, S. K.; Tokita, M.; Watanabe, J. "Unusual Formation of Switchable Hexagonal Columnar Phase by Bent-Shaped Molecules with Low Bent-Angle Naphthalene Central Core and Alkylthio Tail," Jpn. J. Appl. Phys. 2010, 49, (12).

Link, et al., Bilayer-by-bilayer antiferroelectric ordering in freely suspended films of an achiral polymer-monomer liquid crystal mixture, Phys. Rev. E 2000, 61, R37-R40.

Link, et al., Simultaneous Observation of Electric Field Coupling to Longitudinal and Transverse Ferroelectricity in a Chiral Liquid Crystal, Phys. Rev. Lett. 1996, 77, 11, 2237-2240.

Link, et al., Spontaneous Formation of Macroscopic Chiral Domains in a Fluid Smectic Phase of Achiral Molecules, Science, 278, 1924-1927 (1997).

Malenfant, et al., N-type organic thin-film transistor with high field-effect mobility based on a N,N'-dialkyl-3,4,9,10-perylene tetracarboxylic diimide derivative Appl. Phys. Lett., 80, 2517-2519, (2002).

Martinez-Perdiguero, et al., Local structure of the B-4 phase studied by second harmonic generation and X-ray diffraction measurements, J. Mater. Chem., 19, (29), 5161-5166, (2009).

(56) References Cited

OTHER PUBLICATIONS

Matsumoto, et al., "Helical Nanofilaments and the High Chirality Limit of Smectics A," Phys. Rev. Lett., 103, (25), (2009).
McCulloch, et al., "Liquid-crystalline semiconducting polymers with high charge-carrier mobility," Nature Materials, 5, (4), 328-333, (2006).
Meyer, et al., Ferroelectric Liquid Crystals, Phys., Lett. (Orsay, Fr.), 36, L69-L71, (1975).
Miles, et al., Inorganic Photovoltaic Cells, Materials Today, vol. 10, No. 11, pp. 20-27, (2007).
Miyachi, et al., Spontaneous polarization parallel to the tilt plane in the antiferroelectric chiral smectic-Cz phase of liquid crystals as observed by polarized infrared spectroscopy, Phys. Rev. E, Stat. Phys., Plasmas, Fluids, Relat. Interdiscip. Top, vol. 52:3, R2153-R2156, (1995).
Miyake, et al., "Novel chiral filament in an achiral W-shaped liquid crystalline compound," J. Mater. Chem., 15, (44), 4688-4694, (2005).
Morales-Saavedra, et al., "Domain structure studies in phases of bent-shaped molecules by spatially resolved second harmonic microscopy," Mol. Cryst. Liquid Cryst, 413, 2743-2752, (2004).
Morales-Saavedra, et al., "Chlorine-substituted bent-core LC-based sono-gel hybrid materials: Synthesis and optical properties," Mol. Cryst. Liquid Cryst., 488, 56-73, (2008).
Morales-Saavedra, et al., "Polar micro structures of the B-2- and B-4-phases of bent-shaped LC-molecules resolved by nonlinear optical microscopy," Journal of Nonlinear Optical Physics & Materials, 15, (2), 287-302, (2006).
Morales-Saavedra, et al., "Polar ordering in thermotropic mesogens resolved by scanning NLO microscopy," Journal of Nonlinear Optical Physics & Materials, 15, (4), 431-446, (2006).
Nadasi, et al., "B-2-B-4 dimorphism in a new series of banana-shaped mesogens," Mol. Cryst. Liquid Cryst., 399, 69-84, (2003).
Nakata, et al., A racemic layer structure in a chiral bent-core ferroelectric liquid crystal H. Liq. Cryst., 28, 1301-1308, (2001).
Niori, et al., Abstracts of the 16th International Liquid Crystal Conference, Kent, OH, 1996, p. 126, and Distinct Ferroelectric Smectic Liquid Crystals Consisting of Achiral Molecules with Banana Shape; Abstracts of the 16th International Liquid Crystal Conference, Kent State University, Kent, OH, p. 126, (1996).
Niori, et al., Distinct ferroelectric smectic liquid crystals consisting of banana shaped achiral molecules, Materials Chemistry Comm., 6, 1231-1233, (1996).
Niwano, et al., "Chiral Memory on Transition between the B2 and B4 Phases in an Achiral Banana-Shaped Molecular System," J. Phys. Chem. B, 108, (39), 14889-14896, (2004).
Ortega, et al., "Second-harmonic generation studies in the B-2 and B-4 phases of a banana-shaped liquid crystal," Phys. Rev. E, 63, (1), 011702, (2001).
Otani, et al., "Enhanced Optical Activity by Achiral Rod-Like Molecules Nanosegregated in the B-4 Structure of Achiral Bent-Core Molecules," J. Am. Chem. Soc., 131, (34), 12368-12372, (2009).
Otowski, et al., "Dielectric and XRD Investigation of Ferroelectric Liquid Crystal Composed of Banana-Shaped Achiral Molecules," Mol. Cryst. Liquid Cryst., 494, 11-20, (2008).
Pelzl, et al., Preliminary communication Helical superstructures in a novel smectic mesophase formed by achiral banana-shaped molecules Liq. Cryst., 26, 135-139, (1999).
Pelzl, et al., "Banana-shaped compounds—A new field of liquid crystals," Adv. Mater., 11, (9), 707-724, (1999).
Photinos, et al., On the Origins of Spontaneous Polarization in Tilted Smectic Liquid Crystals, Science, vol. 270, 783-786, (1995).
Pindak, et al., Macroscopic Orientation Patterns in Smectic-C Films, Phys. Rev. Lett., 45, 1193-1196, (1980).
Pisula, et al., Liquid Crystalline Ordering and Charge Transport in Semiconducting Materials, Macromol. Rapid Commun., 30, 1179-1202, (2009).
Prasad, V. "Bent-core mesogens with biphenyl moieties: observation of a B-7 to B-4 phase transition," Liq. Cryst., 28, (7), 1115-1120, (2001).
Rastegar, et al., A shear cell for aligning and measuring birefringence of bow-shaped (banana) liquid crystals, G. Rev. Sci. Instrum., 71, 4492-4496, (2000).
Reddinger, J. L.; Reynolds, J. R., Molecular Engineering of π-Conjugated Polymers Adv. Poly. Sci., 145, 57-122, (1999).
Renn, S. R.; Lubensky, T. C., Abrikosov dislocation lattice in a model of the cholesteric-to-smectic-A transition, Phys. Rev. A, 38, 2132-2147, (1988).
Rudquist, et al., Poolar electro-optic switching in droplets of an achiral nematic liquid crystal, J. E. Liq. Cryst., 26, 1555-1561, (1999).
Salfetnikova, J.; Schmalfuss, H.; Nadasi, H.; Weissflog, W.; Kresse, H. "Dielectric characterization of B-3 and B-4 phases," Liq. Cryst., 27, (12), 1663-1667, (2000).
Sekine, T.; Niori, T.; Sone, M.; Watanabe, J.; Choi, S.-W.; Takanishi, Y.; Takezoe, H. "Origin of Helix in Achiral Banana-Shaped Molecular Systems," Jpn. J. Appl. Phys., 36, 6455-6463 (1997).
Sekine, T.; Niori, T.; Watanabe, J.; Furukawa, T.; Choi, S. W.; Takezoe, H. "Spontaneous helix formation in smectic liquid crystals comprising achiral molecules," J. Mater. Chem., 7, (8), 1307-1309, (1997).
Sekine, et al., Ferroelectric Properties in Banana-shaped Achrial Liquid Cystalline Molecular Systems, Jpn. J. Appl. Phys., 36, L1201-L1203, (1997).
Shen, et al., Molecular Design of Nonchiral Bent-Core Liquid Crystals with Antiferroelctric Properties, J. Am. Chem. Soc., vol. 122, 1593-1601, (2000).
Shiromo, K.; Sahade, D. A.; Oda, T.; Nihira, T.; Takanishi, Y.; Ishikawa, K.; Takezoe, H., "Finite enantiomeric excess nucleated in an achiral banana mesogen by chiral alignment surfaces," Angew. Chem. Int. Ed., vol. 44 (13), pp. 1948-1951, (2005).
Shockley, W.; Queisser, H. J., Detailed Balance Limit of Efficiency of pn Junction Solar Cells, J. Appl. Phys., vol. 32, pp. 510-519, (1961).
Stevens, et al., Direct Observation of Enantiomorphous Monolayer Crystals from Enantimoers by Scanning Tunneling Microscopy, Chem., Int. Ed. Engl., 35, 900-901, (1996).
Svoboda, J.; Novotna, V.; Kozmik, V.; Glogarova, M.; Weissflog, W.; Diele, S.; Pelzl, G. "A novel type of banana liquid crystals based on 1-substituted naphthalene-2,7-diol cores," J. Mater. Chem., 13, (9), 2104-2110, (2003).
Szydlowska, et al., Bent-core liquid crystals forming two- and three-dimensional modulated structures, D. Phys. Rev. E, 67, 031702, (2003).
Takanishi, Y.; Shin, G. J.; Jung, J. C.; Choi, S. W.; Ishikawa, K.; Watanabe, J.; Takezoe, H.; Toledano, P. "Observation of very large chiral domains in a liquid crystal phase formed by mixtures of achiral bent-core and rod molecules," J. Mater. Chem., 15, (37), 4020-4024, (2005).
Takekoshi, K.; Ema, K.; Yao, H.; Takanishi, Y.; Watanabe, J.; Takezoe, H. "Appearance of a liquid crystalline nematic-isotropic critical point in a mixture system of rod- and bent-shaped molecules," Phys. Rev. Lett. 2006, 97, (19).
Tenneti, K. K.; Chen, X. F.; Li, C. Y.; Wan, X. H.; Fan, X. H.; Zhou, Q. F.; Rong, L. X.; Hsiao, B. S. "Hierarchical nanostructures of bent-core molecules blended with poly(styrene-b-4-vinylpyridine) block copolymer," Macromolecules 2007, 40, (14), 5095-5102.
Thisayukta, J.; Takezoe, H.; Watanabe, J. "Study on Helical Structure of the B4 Phase Formed from Achiral Banana-Shaped Molecule," Jpn. J. Appl. Phys. 2001, 40, (Part 1, No. 5A), 3277-3287.
Tian, et al., Naphthyl and Thionaphthyl End-Capped Oligothiophenes as Organic Semiconductors: Effect of Chain Length and End-Capping Groups, Adv. Funct. Mater., 17, 1940-1951, (2007).
Tierney, et al., Microwave-assisted synthesis of polythiophenes via the Stille coupling, Synthetic Met., 148, 195-198, (2005).
Tsuzuki et al, "Photoelectrical conversion of p-n heterojunction devices using thin films of titanyl phthalocyanine and a perylene pigment," Thin Solid Films, vol. 273, (1996), 177-180.
Van Breemen, A. J. J. M.; Herwig, P. T.; Chlon, C. H. T.; Sweelssen, J.; Schoo, H. F., M.; Setayesh, S.; Hardeman, W. M.; Martin, C. A.; de Leeuw, D. M.; Valeton, J. J. Chem. Soc. 2006, 128, 2336-2345.

(56) References Cited

OTHER PUBLICATIONS

Viswanathan, et al., Spontaneous chiral symmetry breaking by achiral molecules in a Langmuir-Blodgett film, Nature, vol. 368, 440-443, (1994).
Eckhardt, et al., Separation of chiral phases in monolayer crystals of racemic amphiphiles, Nature, 362, 614-616, (1993).
Nassoy, et al., Spontaneous Chiral Segregation in Bidimensional Films, Phys. Rev. Lett., 75,457-460, (1995).
Weissbuch, et al., Separation of Enantiomers and Racemate Formation in Two-Dimensional Crystals at the Water Surface from Racemic R-Amino Acid Amphiphiles: Design and Structure, Am. Chem. Soc., 119, 933-942 (1997).
Vizitiu, et al., Ferroelectric Liquid Crystals Induced by Atropisomeric Biphenyl Dopants: Dependence of the Polarization Power on the Nature of the Symmetry-Breaking Groups Chem. Mater., 13, 1692-1699 (2001).
Walba, et al., Antiferroelectric Liquid Crystals from Achiral Molecules and a Liquid Conglomerate, Liquid Crystal Material and Devices, Symposium Proceedings vol. 559, pp. 3-14, Editors Bunning et al., (1999).
Walba, et. al, On the Nature of the B4 Banana Phase: Crystal or Not a Crystal? Crystal Growth & Design, vol. 5, No. 6, pp. 2091-2099, (2005).
Walba, D.M., Ferroelectric Liquid Crystals, a Unique State of Matter, Advances in the Synthesis and Reactivity of Solids, vol. 1, pp. 173-235.
Walba, et al., Supermolecular stereochemistry in ferroelectric liquid crystals, J. Phys. Org. Chem., 13, 830-836, (2000).
Walba, et al., A Ferroelectric Liquid Crystal Conglomerate Composed of Racemic Science, 288, 2181-2184, (2000).
Walba, et al., Design and Synthesis of a New Ferroelectric Liquid Crystal Family, J. Am. Chem. Soc., 108, 5210-5221, (1986).
Walba, et al., Detecting Molecular Chirality by Scanning Tunneling Microscopy Acc. Chem. Res., 29, 591-597, (1996).
Wasserman, E. J., Communications to the Editor: The Preparation of Interlocking Rings: A Catenane, Am. Chem. Soc., 82,4433-4434, (1960).
Wasserman, E.J., Chemical Topology, E. Sci. Am., 207, 94-100, (1962).
Watanabe, J., Hayashi, M., Thermotropic Liquid Crystals of Polyesters Having a Mesogenic p,p'-Bibenzoate Unit, Macromolecules, 22, 4083-4088, (1989).
Watanabe, J.; Niori, T.; Sekine, T.; Takezoe, H. "Frustrated Structure induced on ferroelectric smectic phases in banana-shaped molecular system," Jpn. J. Appl. Phys., 37, L139-L142, (1998).
Weinan, E.; Palffy-Muhoray, P. J., Dynamics of Filaments during the Isotropic-Smectic A Phase Transition Nonlinear Sci., 9, 417-437, (1999).
Weis, R. M.; McConnell, H. M., Two-dimensional chiral crystals of phospholipid, Letters to Nature, Nature, 310, 47-49, (1984).
Weissflog, et al., "New banana-shaped mesogens," Proc. SPIE-Int. Soc. Opt. Eng., 3319, 14-19, (1998).
Weissflog, et al., Influence of lateral substituents on the mesophase behaviour of banana-shaped mesogens, J. Mater. Chem., 11, 2748-2758, (2001).
Yamaguchi, A.; Nishiyama, I.; Yamamoto, J.; Yokoyama, H.; Yoshizawa, A., "Unusual smectic phases organized by novel lambda-shaped mesogenic molecules," J. Mater. Chem. 2005, 15, (2), 280-288.
Yamazaki, Y.; Takanishi, Y.; Yamamoto, J. "Dynamic heterogeneity of a nanostructure in the hyper-swollen B4 phase of achiral bent-core molecules diluted with rod-like liquid crystals," Epl 2009, 88, (5).
Young, et al.,Light-Scattering Study of Two-Dimensional Molecular-Orientation Fluctations in a Freely Suspended Ferroelectric Liquid-Crystal Film, Phys. Rev. Lett., 40, 773-776, (1978).
Yuen, et al., "Nonlinear transport in semiconducting polymers at high carrier densities," Nature Materials, 8, (7), 572-575, (2009).
Zeng, et al., "The use of nanoimprint lithography to improve efficiencies of bilayer organic solar cells based on P3HT and a small molecule acceptor," Thin Solid Films 2009, 517, (24), 6833-6836.
Zhang, Y.; Schuster, G. B. J., S Search for Photoresolvable Mesogens: Sybnthesis and Properties of a Series of Liquid Crystalline, Axially Chiral 1-Benzylidene-4-[4'-[(p-alkylphenly)ethynyl]phenyl] cyclohexanes, Org. Chem., 59, 1855-1862, (1994).
Zhu, C.; Chen, D.; Shen, Y.; Jones, C. D.; Glaser, M. A.; Maclennan, J. E.; Clark, N. A. "Nanophase segregation in binary mixtures of a bent-core and a rodlike liquid-crystal molecule," Phys. Rev. E 2010, 81, (011704), 011704-1-011704-5.

ORGANIC PHOTOVOTAICS

RELATED APPLICATIONS

This application claims benefit of priority to provisional U.S. Patent Application Ser. No. 61/597,273 filed Feb. 10, 2012, which is incorporated by reference, to the same extent as though fully replicated herein.

STATEMENT OF GOVERNMENT SUPPORT

This invention was made with government support under grant number DMR0820579 awarded by the National Science Foundation. The government has certain rights in the invention.

FIELD OF THE INVENTION

The present disclosure generally relates to improved organic semiconductors and improved organic photovoltaics using liquid crystalline bent-core molecules in a B4 subphase.

BACKGROUND

There are three common states of matter, solid, liquid, and gas. Liquid crystal (LC) is a fourth state that certain kinds of matter can enter into under the right conditions. Molecules in solids exhibit both positional and orientational order. The molecules are constrained to point only certain directions and to be only in certain positions with respect to each other. In liquids, the molecules do not have any positional or orientational order, the direction the molecules point and their positions are random.

The liquid crystal phase exists between the solid and the liquid phase. The molecules in liquid crystal may or may not possess any positional order, but they do possess a certain degree of orientational order. The molecules do not all orient the same direction all the time, they just tend to orient more in one direction over time than other directions. This direction is referred to as the director of the liquid crystal.

Most liquid crystal compounds exhibit more than one phase in the liquid crystalline state. The term mesophase is used to describe liquid crystal phases of materials. Different mesophases are formed by changing the amount of order in the sample, either by imposing order in only one or two dimensions, or by allowing the molecules to have a degree of translational motion. Typically phase transitions occur with changing temperature (thermotropic liquid crystals)

A mesogen is the fundamental unit of a liquid crystal, a molecule or small supramolecular assembly, that induces structural order in the fluid phases. Typically, a liquid crystalline molecule consists of a rigid moiety and one or more flexible parts. The rigid part (the core) is the major driver of orientational order, whereas the flexible parts (tails) induce fluidity in the liquid crystal. The optimum balance of the rigid and fluid parts is essential to forming liquid crystalline materials.

The tendency of liquid crystal molecules to point along the director leads to a condition known as anisotropy. Anisotropy means that the properties of a material depend on the direction in which they are measured. If the alignment is large, the material is very anisotropic. Similarly, if the alignment is small, the material is almost isotropic. The anisotropic nature of liquid crystals is responsible for their unique optical properties.

The nematic liquid crystal subphase is characterized by molecules that have no positional order but tend to point in the same direction along the director. The molecules point vertically but are arranged with no particular order.

The smectic state is another distinct mesophase of liquid crystal substances. In this mesophase, the molecules have one-dimensional positional order, forming a lamellar structure. Molecules in this phase show a degree of translational order not present in the nematic. In the smectic state, the molecules maintain the general orientational order of nematics, but also tend to align themselves in layers or planes. Motion is restricted to within these planes, and separate planes are observed to flow past each other. In some smectic mesophases, the molecules are affected by the various layers above and below them. Therefore, a small amount of three dimensional order is observed. The increased order means that the smectic state is more "solid-like" than the nematic. Many compounds are observed to form more than one type of smectic phase; as many as 12 of these variations have been identified.

Chirality is a property of a molecule. A molecule is either chiral or achiral. If a molecule is chiral, it means that it is non-superimposible upon its mirror image. A chiral molecule will interact with polarized light. The properties of the light will change after it has interacted with the chiral molecule. For example, in a given chiral smectic mesophase, the director makes a tilt angle with respect to the smectic layer. The director of the chiral smectic mesophase is not parallel or perpendicular to the layers, it rotates from one layer to the next.

Liquid crystals can be formed from many different kinds of compounds. Many of the liquid crystalline compounds are rod like, some are disc like and still others have a bent-core structure. Several liquid crystalline subphases exist for each of these different compounds. Rod shaped and disc shaped liquid crystalline molecules have been thoroughly studied. However, bent-core liquid crystalline molecules have only recently been studied using techniques from both condensed-matter physics and chemistry. The most commonly studied bent-core molecules are alkyl-tailed bis-Schiff base bent-core diesters, see FIG. 1. R is $C_nH_{2n+1}$ were n suitably ranges from 7 to 18.

One particular molecule of this family, the n-nonyl tailed version (NOBOW), is commonly used as a representative bent-core material in experiments. Most commonly, there are seven different liquid crystalline subphases observed in bent-core liquid crystalline molecules; B1, B2, B3, B4, B5, B6 and B7. Each subphase possesses its own unique physical properties. The characteristics of the subphases are due to multiple, competing forces at work within a given subphase. There is usually a competition between local preference and global ordering between chirality and layering, present in all chiral crystals and layered chiral liquid crystals. The chiral packing of molecules induces local molecular twist, but macroscopic ordering into layers expels twist, leaving the local organization strained. In fluid layered, smectic liquid crystals of rod-shaped molecules, this competition produces inhomogeneous phases in which molecular and layer twist coexist, the latter enabled by periodic arrays of twist grain boundaries or melted sheets. Systems of simple bent-core molecules having a particularly strong coupling between chirality and layering originate from the requirement to accommodate the size and shape of molecular sub-fragments in the presence of a robust tendency for layering. The bent-core molecules are achiral, but spontaneous polar order and chirality appear as broken symmetries, coupling to drive local Gaussian curvature, also known as saddle splay deformation, of the layers. This Gaussian curvature is a local solution that cannot fill space. This frustration leads to a spectacular hierarchical structure in which layering can appear only if twisted, doing so in the form of nanofilaments of twisted layers, see FIG. 4. The nanofilaments in turn collectively organize into a homochiral liquid crystalline array with coherent twist. Such macroscopic nanoporous assemblies of helically precessing layers are unanticipated solutions to the problem of obtaining coexisting layering and twist in a condensed phase.

As shown in FIG. 4A, NOBOW molecules form layers with negative curvature. The structure if polar along the ribbon axis, indicated by the vector P. FIG. 4B shows that twisted layers self-assemble into nanorods composed of 5-7 layers. The rods are self-limiting in size in two dimensions due to the free energy cost of deviating from the preferred curvature. FIG. 4C is a freeze fracture transmission electron photomicrograph showing nanorods with twist "in phase" in an LC of rods.

Different bent-core molecules are predisposed to forming different subphases. The B1 subphase occurs only in the shorter-tailed members of the bent-core molecules. NOBOW, having a nine carbon alkyl tail at both of its ends, exhibits only the B2, B3, and B4 phases. Although each of these B subphases consists of some packing structure dependent on the bent nature of the molecules, little is known about how to predict phase sequence based on chemical structure. Certain groups within the structure of the bent-core molecule are known to encourage specific behaviors, but small changes can have drastic effects on the mesogen behavior of the molecule. For example, simply changing the length of the tail can cause the disappearance of a phase, or change its transition temperatures.

The B4 phase is unique to bent-core molecules. It typically occurs towards the lower end of the liquid crystal temperature range for molecules that exhibit it. The B4 phase often, but not always, forms as a conglomerate consisting of large (typically hundreds of microns across) heterochiral domains, so although it has a helical structure it is not biased towards one handedness or another. When viewed through a crossed polarizer and analyzer its texture is blue (or occasionally grey) and almost featureless, but when polarizer and analyzer are decrossed in one direction half the domains darken and half brighten. If decrossed in the other direction, then the domains that were previously darkened are now brightened, and vice-versa. This behavior is consistent with a phase that is achiral overall, though it consists of a conglomerate of chiral domains. It therefore is not caused by molecular chirality but by macroscopic, phase-induced chirality. Materials reported to demonstrate the B4 phase include, without limitation, those reported in the attached BIBLIOGRAPHY. Some molecules that enter the B4 phase do not show chiral domains in the neat material.

B4 materials are characterized by twisted rods, or layer fragments with negative curvature. A generally known B4 "texture" ascertainable by transmission electron microscopy ("TEM") is also diagnostic to persons of ordinary skill ion the art. By way of example, one skilled in the art may observe the texture of freeze-fracture TEM to recognize the B4 texture as reported in Hough et al., "Helical nanofilament phases," Science 2009, 325, (5939), 456-460. Additional confirmation of the B4 phase may reside in the observation of twisted nanorods grown from the neat LC, or from solution, and also in the observation of slow dynamics by solid state NMR.

Development of new materials capable of providing useful solar energy less expensively than coal is certainly one of the most challenging problems facing society. Solar energy is captured for useful electrical power using a photovoltaic (PV) cell, also known as a solar cell. PVs may be made from inorganic (IPV) or organic (OPV) materials. OPVs are one of several contenders in renewable energy technology potentially providing a way to convert solar energy into electricity using inexpensive organic materials and devices. By way of example, U.S. Pat. No. 8,357,849 describes organic the operation of organic photovoltaic devices in terms of relative energy levels. A first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

In the context of organic materials, the terms "donor" and "acceptor" refer to the relative positions of the HOMO and LUMO energy levels of two contacting but different organic materials. This is in contrast to the use of these terms in the inorganic context, where "donor" and "acceptor" may refer to types of dopants that may be used to create inorganic n- and p-types layers, respectively. In the organic context, if the LUMO energy level of one material in contact with another is lower, then that material is an acceptor. Otherwise it is a donor. It is energetically favorable, in the absence of an external bias, for electrons at a donor-acceptor junction to move into the acceptor material, and for holes to move into the donor material. A significant property in organic semiconductors is carrier mobility. Mobility measures the ease with which a charge carrier can move through a conducting material in response to an electric field. In the context of organic photosensitive devices, a layer including a material that conducts preferentially by electrons due to a high electron mobility may be referred to as an electron transport layer, or ETL. A layer including a material that conducts preferentially by holes due to a high hole mobility may be referred to as a hole transport layer, or HTL. Preferably, but not necessarily, an acceptor material is an ETL and a donor material is a HTL.

Conventional inorganic semiconductor PV cells employ a p-n junction to establish an internal field. Early organic thin film cells, such as reported by Tang, Appl. Phys Lett. 48, 183 (1986), contain a heterojunction analogous to that employed in a conventional inorganic PV cell. However, it is now recognized that in addition to the establishment of a p-n type junction, the energy level offset of the heterojunction also plays an important role. The energy level offset at the organic D-A heterojunction is believed to be important to the operation of organic PV devices due to the fundamental nature of the photogeneration process in organic materials. Upon optical excitation of an organic material, localized Frenkel or charge-transfer excitons are generated. For electrical detection or current generation to occur, the bound excitons must be dissociated into their constituent electrons and holes. Such a process can be induced by the built-in electric field, but the efficiency at the electric fields typically found in organic devices (F~$10^6$ V/cm) is low. The most efficient exciton dissociation in organic materials occurs at a donor-acceptor (D-A) interface. At such an interface, the donor material with a low ionization potential forms a heterojunction with an acceptor material with a high electron affinity. Depending on the alignment of the energy levels of the donor and acceptor materials, the dissociation of the exciton can become energetically favorable at such an interface, leading to a free electron polaron in the acceptor material and a free hole polaron in the donor material.

Solar cells are characterized by the efficiency with which they can convert incident solar power to useful electric power. Devices utilizing crystalline or amorphous silicon dominate commercial applications, and some have achieved efficiencies of 41% or greater. However, efficient crystalline-based devices, especially of large surface area, are difficult and expensive to produce due to the problems inherent in producing large crystals without significant efficiency degrading defects. On the other hand, high efficiency amorphous silicon devices still suffer from problems with stability. Present commercially available amorphous silicon cells have stabilized efficiencies between 4 and 8%. More recent efforts have focused on the use of organic photovoltaic cells to achieve acceptable photovoltaic conversion efficiencies with economical production costs. These materials, if sufficiently cheap to manufacture, could compete with using polluting fossil fuels as a source of energy.

Currently the most commonly used PVs are made of inorganic materials. In inorganic materials, fine control of electronic properties is required to achieve the desired photovoltaic behavior. The material is doped to increase the number of negative (n-type) charge carriers, typically electrons, or positive (p-type) charge carriers, typically called "holes." This is accomplished by replacing some fraction of the atoms with elements having less or more valence electrons, creating a deficit or surplus of electrons. The resulting p- and n-type semiconductors are then joined to form a p-n heterojunction that allows the generation of electricity when illuminated. As a photon strikes the material, an electron-hole pair is created. These will typically recombine within microseconds, but if this pair is close enough to the p-n heterojunction the two can separate from each other and generate current.

In semiconductors and insulators, electrons are confined to a number of bands of energy, and forbidden from other regions. The term "band gap" refers to the energy difference between the top of the valence band and the bottom of the conduction band. Electrons are able to jump from one band to another. However, in order for an electron to jump from a valence band to a conduction band, it requires a specific minimum amount of energy for the transition. The required energy differs with different materials. Electrons can gain enough energy to jump to the conduction band by absorbing either a phonon (heat) or a photon (light).

Semiconductors have a small but nonzero band gap which behaves as an insulator at absolute zero but allows thermal excitation of electrons into its conduction band at temperatures which are below its melting point. In contrast, a material with a large band gap is an insulator. In conductors, the valence and conduction bands may overlap, so they may not have a band gap.

The conductivity of intrinsic semiconductors is strongly dependent on the band gap. The only available carriers for conduction are the electrons which have enough thermal energy to be excited across the band gap. For instance, the band gap of silicon is 1.1 eV, so it is incapable of absorbing any photons with less energy than this. However, if a higher-energy photon is absorbed by silicon, all energy over 1.1 eV is dissipated as heat. Therefore, PVs must be engineered to have the correct band gap.

OPV devices typically have relatively low quantum yield (the ratio of photons absorbed to carrier pairs generated, or electromagnetic radiation to electricity conversion efficiency), being on the order of 1% or less, but may reach up to about 8% in the most recent OPV devices. This is, in part, thought to be due to the second order nature of the intrinsic photoconductive process. That is, carrier generation requires exciton generation, diffusion and ionization.

An exciton is a bound state of an electron and hole which are attracted to each other by the electrostatic Coulomb force. It is an electrically neutral quasiparticle that exists in insulators, semiconductors and some liquids. The exciton is regarded as an elementary excitation of condensed matter that can transport energy without transporting net electric charge.

An exciton forms when a photon is absorbed by a semiconductor. This excites an electron from the valence band into the conduction band. In turn, this leaves behind a localized positively-charged hole. The electron in the conduction band is then attracted to this localized hole by the Coulomb force.

In semiconductor production, doping intentionally introduces impurities into an extremely pure semiconductor for the purpose of modulating its electrical properties. One difficulty with doping in OPV cells is that the integrity of the organic semiconductor materials are often chemically or morphologically disturbed, which can create exciton traps or quenching sites that block diffusion and/or cause recombination. This difficulty can be overcome by using OPVs that are made from LCs due to the fluid-like nature of the LCs and thus their ability to "repair" any such flaws in the semiconductor material through minor translations of the constituent molecules. The B-4 subphase is a liquid crystal of nanorods, each composed of crystalline layers. The rods have crystalline characteristics.

Efficient movement of exitons through an OPV is a necessary quality of any organic solar cell. One significant measurement of the ability of OPVs to propagate the movement of exitons is carrier mobility. Carrier mobility measures the ease with which a charge carrier can move through a conducting material in response to an electric field. As opposed to free carrier concentrations, carrier mobility is determined in large part by intrinsic properties of the organic material such as crystal symmetry and periodicity. Appropriate symmetry and periodicity can produce higher quantum wavefunction overlap of highest occupied molecular orbital (HOMO) levels producing higher hole mobility, or similarly, higher overlap of lowest unoccupied molecular orbital (LUMO) levels to produce higher electron mobility. Moreover, the donor or acceptor nature of an organic semiconductor may be at odds with higher carrier mobility. How to pair two organic photoconductive materials to serve as a donor and an acceptor in a photovoltaic heterojunction based upon carrier mobilities and relative HOMO and LUMO levels is well known in the art, and is not addressed here.

For additional background explanation and description of organic photosensitive devices, including their general construction, characteristics, materials, and features, see U.S. Pat. Nos. 6,657,378, 6,580,027 and 6,352,777 which are hereby incorporated by reference to the same extent as though fully replicated herein.

SUMMARY OF THE INVENTION

The present disclosure merges three disciplines organic semiconductors, OPVs and liquid crystals, in the context of a newly discovered LC phase, the B4 phase. Herein the term "semiconductor" denotes materials which can conduct electricity when charge carriers are induced by thermal or electromagnetic excitation. The term "photoconductive" generally relates to the process in which electromagnetic radiant energy is absorbed and thereby converted to excitation energy of electric charge carriers so that the carriers can conduct, i.e., transport, electric charge in a material. The terms "photoconductor", "photovoltaic", "photooptic", and "photoconductive material" are used herein interchangeably to refer to semiconductor materials which are chosen for their property of absorbing electromagnetic radiation to generate electric charge carriers.

The following definitions of terms used to describe semiconductors and photovoltaics of the present disclosure are for purposes of explanation only and are not meant to be limiting for any embodiment of the present disclosure.

As used herein, the "valence band" is the highest range of electron energies in which electrons are normally present at absolute zero. The valence electrons are bound to individual atoms, as opposed to conduction electrons which can be found in conductors and semiconductors that can move freely within the atomic lattice of a material. As used herein, the "conduction band" is the range of electron energies, higher than that of the valence band, sufficient to free an electron from binding with its individual atom and allow it to move freely within the atomic lattice of the material. Electrons within the conduction band are mobile charge carriers in solids, responsible for conduction of electric currents in metals and other good electrical conductors. The valence band and the conduction band are separated in insulators and semiconductors by a band gap, but in metals the conduction band has no energy gap separating it from the valence band.

Electrons are confined to a number of bands of energy, and forbidden from other regions. As used herein, the term "band gap" refers to the energy difference between the top of the valence band and the bottom of the conduction band. Electrons are able to jump from one band to another. However, in order for an electron to jump from a valence band to a conduction band, it requires a specific minimum amount of energy for the transition. The required energy differs with different materials. Electrons can gain enough energy to jump to the conduction band by absorbing either a phonon (heat) or a photon (light).

The conductivity of intrinsic semiconductors is strongly dependent on the band gap. The only available carriers for conduction are the electrons which have enough thermal energy to be excited across the band gap.

Band gap engineering is the process of controlling or altering the band gap of a material by controlling the composition of certain semiconductor alloys, molecules or other substances. It is possible to construct layered materials, such as solar cells, with alternating compositions by techniques like molecular beam epitaxy, molecular vapor deposition, chemical layer deposition and similar techniques for layering on a surface.

As used herein, the "work function" is the minimum energy that must be given to an electron to liberate it from the surface of a particular substance. The work function is a characteristic property for any solid face of a substance with a conduction band whether or not it is empty or partly filled. As used herein, in the "photoelectric effect" electron excitation is achieved by absorption of a photon. If the photon's energy is greater than the substance's work function, photoelectric emission occurs and the electron is liberated from the surface. Excess photon energy results in a liberated electron with non-zero kinetic energy.

B4 phase liquid crystals are bent-core molecules that have been shown to form liquid crystal phases that are chiral although the individual molecules are achiral. In any particular sample, various domains will have opposite handedness, but within any given domain strong chiral ordering will be present. The mechanism of this macroscopic chirality is due to the molecules stacking in layers with spontaneous polar order and having a tilt normal to the polar axis whereby they orient themselves in a tilted fashion inside the layers. The B4 phase is neither ferroelectric nor anti-ferroelectric. The novel combination of properties of these B4 phase liquid crystals lends them too many different applications. One such application is in the general area of semiconductors, electrooptics, and photooptic devices including photovoltaics.

The B4 structure of the diester of FIG. 1 was shown to be a hierarchical assembly. As indicated in FIG. 4A-C, single LC layers prefer Gaussian curvature, leading to twisted ribbons with a pitch of 180 nm. It is thought that this twist is driven by strong intermolecular association of the right and left "wings" of the bent-core with the interaction "stretched" in orthogonal planes. Strain caused by the covalent linkage of the two halves is relieved by layer curvature. These layers then stack to form nanorods, trying to fill space with a smectic, layered, LC structure. This structure is frustrated by the curvature of the layers since it is not possible to fill space with twisted layers while maintaining a constant preferred curvature. Therefore, the rods end up with 5-7 layers, and are about 30 nm in width by about 30 nm in depth, see FIG. 4A-C. There is no intrinsic limit to the length of the rods.

The nanorods form a hexatic liquid crystalline structure which can be discerned by careful examination of electron diffraction of B4 samples. However, their exact structure is unknown. Electron diffraction from flattened layers of NOBOW B4 phase show in-layer ordering common in hexatic LCs. However, a solid state carbon 13 nuclear magnetic resonance (NMR) study of this material shows slow dynamics and unexpected diastereotopism more consistent with a crystalline phase. Small angle X-ray scattering from B4 is consistent with the nanorod structure. Wide angle X-ray scattering proves in-layer structure.

Further characterization of the B4 phase of NOBOW molecules shows spontaneous reflection symmetry breaking in smectic LCs. This results from a combination of spontaneous nonpolar symmetry breaking and spontaneous tilt in B4 phases composed of bent-core mesogens. These symmetry breakings occur in smectic layers which are then seen to stack in such a way that four diastereomeric phases, two conglomerates and two macroscopic racemates, are possible if only synclinic or anticlinic layer interfaces occur. The four diastereomers, comprised of two ferroelectric and two antiferroelectric isomers, were first proposed to explain the electrooptics of NOBOW mesogens.

In one example, a NOBOW class of molecules in the B2 phase exhibited the two antiferroelectric phases, with the ferroelectric structures observed only as states in the presence of an applied electric field. Other examples of these mesogens possess each of the two possible ferroelectric diastereomers as the ground state. Such mesogens have been obtained by using layer interface clinicity as the supermolecular stereochemical control element. Typically, B4 materials form from high temperature smectic LCs. For example, the B4 phase of NOBOW, herein also referred to generally as the NOBOW class of molecules, grows on cooling from a B2 smectic phase at 150° C., and freezes into a glass at about 80° C. The B4 phase of NOBOW is indefinitely stable at temperatures below 150° C., and does not bulk crystallize at low temperatures. The B4 phases of compounds of the present disclosure may behave similarly. White powders known to be composed of B4 nanorods are produced after stripping solvent from compounds of the present disclosure. The B4 compounds, therefore, are likely to be very stable over a broad temperature range.

The B4 phase has very low linear birefringence (almost to the point of being optically isotropic) but high circular birefringence. In powder X-ray diffraction, B4 materials show several peaks at the B2-B4 phase transition. The sharp peaks of the B2 phase give way to a broad peak, which indicates that the ordering in the B4 phase is short-range only. In wide-angle X-ray, the broad peak that indicates fluid in-plane behavior of the smectic B2 phase is replaced by several sharper peaks in the B4, indicating a more rigid hexatic structure. However, the broad small angle peak indicates that the B4 phase lacks the long-range lamellar order of the B2 phase. NMR spectra taken with $^{13}$C cross-polarization magic angle spinning show that the phase gives quantitative integrals over a very broad temperature range and exhibits slow interconversions from aromatic ring rotation, indicating a rigid crystalline structure. One theory is that the B4 phase is a crystal with plentiful defects, giving it a short coherence length for positional order. Freeze-fracture experiments done on these B4 materials mixed with 8CB (an immiscible nematic material) point to the existence of helical nanofilaments. These tiny domains are shaped like nanoscale ropes and are made of several layers of liquid crystal twisted into a tight helix; see FIG. 4A-C, for example.

At the temperatures where the B4 phase exists layer flatness becomes thermodynamically unfavorable and saddle splay occurs. This negative curvature limits each filament to 5-7 layers. Beyond 5-7 layers, the curvature becomes too small, see FIG. 4A-C. The filaments can then pack side-by-side to form the B4 phase. The handedness of twist varies between macrodomains, explaining the conglomerate behavior. This also explains the X-ray and NMR data. Within each rope, the structure is similar to a rigid crystal, but the nanodomains do not exhibit strong ordering between themselves. This also explains the multiple peaks visible in wide-angle X-ray for B4 in that they are due to the slightly different environments experienced by layers in the middle of the filament compared to layers on the outside of the filaments. Since the filament is limited to 5-7 layers, it is reasonable to see 3-4 peaks appearing in the X-ray spectrum. When mixed with sufficient 8CB, these nanofilaments remain intact but are spaced out enough that they are individually visible with freeze-fracturing. In the bulk, the filament structure is less obvious but the texture is still similar to that shown within clusters of filaments.

Atomic-force microscopy (AFM) and freeze-frame transmission electron microscopy (FFTEM) images confirm this rope model. With these methods it is possible to image all three characteristic length scales of the B4 phase. The individual layer spacing, d, is typically about 5 nm, the filament thickness, w, is typically about 25 nm, and the half-pitch of the filament twist, h, is typically about 100 nm.

Due to their unique structure, the B4 nanorod system is well suited for molecular electronics applications, with expected high carrier mobilities along and across the rods. About one half of the surface area of the rods are layer edges, where the aromatic core of the mesogens is exposed, and one half the surface area composed of aliphatic (insulating) tail sublayers. The structure within layers may be one in which aromatic molecules are stacked face to face in two sublayers within a single crystalline layer, where the crystal lattices in the sublayers are nearly perpendicular. Additionally, macroscopic alignment of the molecules is possible, further enhancing their potential for molecular electronics applications.

In one embodiment of the present disclosure, a thin film of a prototypical B4 material possessing benzylidene aniline aromatic units is formed by spinning from solution, presumably forming a film of the nanorod phase. Buckminsterfullerene ($C_{60}$) could then be evaporated onto the B4 film (this B4 material could, for example, be stable from 155° C. to presumably absolute zero, but definitely at the temperature of liquid propane) to make a single heterojunction between the p-type semiconductor of the benzylidene aniline aromatic units and the n-type semiconductor of the buckminsterfullerene molecules. Irradiation of the sample at a wavelength to excite the $C_{60}$ could be at about 440 nm which would be expected to create excitons within the material. The generation and movement of the excitons through the material could then be followed by time-resolved microwave absorption. Analysis of the microwave absorption spectrum of these molecules over time provides information on the electronic structure of the molecules. Such time-resolved microwave absorption, therefore, would be expected show a large signal which could be long-lived. A long-lived signal would be a sign of high carrier mobility within the material.

If carrier mobilities on the order of 1 $cm^2$ per Vs or higher are obtained, and the B4 rods can be aligned by microgrooves with appropriate geometry, such materials could be transformative in the organic semiconductor and OPV fields. Such materials could have potentially improved properties, taking advantage of the flexibility of design of organics with control of band gaps and optical absorption properties using well known design principles and precedents.

Almost all the molecules that exhibit the B4 phase contain the Schiff base functional group, or imine. Since this group is vulnerable to hydrolysis under ambient conditions at room temperature and atmospheric moisture, this significantly limits their use in commercial applications and even makes purification and characterization methods difficult. Therefore, an aim of the present disclosure is to synthesize B4 bent-core LC materials that do not contain a Schiff base or imine functional group. By way of example, in the attached Bibliography A, the reference Bialecka-Florjanczyk et al. discloses a proposed B4 material with no benzylidene aniline groups.

Previously known B4 mesogens have all been closely related to NOBOW, but the homologous unsymmetrical diesters of FIG. 2 exhibit the B4 phase but with very different metrics than the NOBOW class. For example, the helix pitch in the new B4 materials appears to be shorter than that of NOBOW B4, and the nanorods seem to be smaller in width and depth. The phases are clearly a B4 variant, however, as evidenced by FFTEM imaging and X-ray scattering.

W513 is an example of a bent-core molecule that exhibits the B4 phase, yet does not contain a Schiff base, see FIG. 2. The bent-core, banana, shape of the molecule is provided by a central 3,4'-substituted biphenyl moiety. The two rigid side-arms consist of 4,4'-substituted biphenyl units, and the tails are n-decyl. The pitch of the filaments formed by W513 is about 50 nm as compared to about 100 nm for NOBOW. W513 molecules can also be "swollen" by addition of small molecules such as simple LCs. For example, 8-cyanobiphenyl can swell the nanorod phase of W513 filaments up to 20% by weight before bulk phase separation occurs.

FIG. 3 shows generally the B4 class of bent core molecule that is capable of forming the B4 phase. R is $C_nH_{2n+1}$ were n suitably ranges from 7 to 18.

In an embodiment of the present disclosure, W513 bent-core molecules and other bent-core molecules that do not have a Schiff-base or imine functional group can be used to make OPVs. These molecules are also referred to herein as the W513 class of molecules. Such molecules could still exhibit the unique properties of the B4 bent-core LC OPVs but would be expected to be more resistant to degradation due to exposure to the environment in which they are used.

Since a small change in structure can result in different transition temperatures or the appearance of new phases, a number of similar compounds could be synthesized that exhibit the desired characteristics. The choice of tails could be based on common liquid crystal tail units. The alkyl tails need to be long enough that crystallization is discouraged enough to produce mesophases. For this reason the ten-, twelve- and fourteen-carbon alkyl groups may be used. The perfluoroether tails are known to promote higher temperature mesophases and may be chosen for this reason. The branched alkyl tail could be chosen because the side methyl group is known to disrupt packing order and perhaps promote lower transition temperatures.

According to one instrumentality of the present disclosure, a new platform for design and synthesis of OPV systems is presented. The basic solar cell design could involve a B4 array of nanorods oriented with a very high degree of order. The B4 composites could be a donor or an acceptor or both. The nanorods could contain NOBOW and/or modified W513 B4 phase molecular units packed into a crystal structure, which could absorb light to form exitons and promote charge transfer from the rods to acceptors in the surrounding matrix that could be incorporated by swelling the B4 phase with the appropriate acceptor materials. Such materials used for swelling the B4 phase could be oligothiophene smectics and/or fullerenes in a non-volatile solvent system, for example. The holes produced in the rods could have a very high mobility along the rod axis due to the crystalline nature of the NOBOW and/or W513 stacks in-side each layer. In this kind of a system, the surface area between donor and acceptor phases could be extremely high, which might be a very advantageous feature.

The synthetic scheme that can be used in an embodiment of the disclosure lends itself to the creation of a wide variety of compounds. For instance, it could be relatively simple to substitute in different chains of thiophenes containing one of more heterocycles, in order to adjust the p-type or n-type character of the materials. In an embodiment of the present disclosure, two heterocyclic systems of interest are oxadiazoles and carbazoles to be used to adjust the p-type or n-type character of the materials. Additionally, the NOBOW and W513 class of molecules can be modified along their backbone or at the tails at each end of the molecule.

Traditionally, photosensitive optoelectronic devices have been constructed of a number of inorganic semiconductors, e.g., crystalline, polycrystalline and amorphous silicon, gallium arsenide, cadmium telluride and others. Photovoltaics are materials capable of converting solar radiation directly into DC electricity. Materials commercially available at present include amorphous silicon, polycrystalline silicon, micro-crystalline silicon, cadmium telluride, and copper/indium/gallium/diselenide or disulfide, all of which are inorganic. Purity and crystalline grain size are a large determinant of efficiency in these cells, the smaller the grains and the more impure the material, the lower the efficiency. The drawback to using these typical inorganic photovoltaic materials is that processing is often quite expensive and energy-intensive. Pure monocrystalline silicon requires rigorous purification and very slow cooling from a melt, and other methods require techniques like vapor deposition.

Since B4 nanorods of the present disclosure are composed of crystalline layers, the wings of the bent-core structure may be composed of semiconducting aromatic oligomers. According to one aspect of the present disclosure, these B4 nanorods may be a new class of OPVs and other semiconducting materials. Many different B4 OPV molecules can be designed. B4 molecules used for organic semiconductors and therefore for OPV applications could include the NOBOW class of molecules or the W513 class of molecules.

Organic semiconductors have several advantages over inorganic semiconductors, many of which are based on the ease of processing required. They can typically be cast from solvent, for example. Organic materials also offer the possibility of flexible, lightweight solar cells, allowing their use in numerous applications for which inorganics are unsuitable. Additionally, rare elements present in inorganics, such as indium, are not needed for organic materials, dramatically lowering the materials' costs. Although organics are not intrinsically purer than inorganics, it should in principle be easier to achieve a given level of purity, and require significantly less energy in doing so.

The biggest drawback of previously known liquid crystalline or polymer organic semiconductors is their low charge carrier mobility. This is caused by disordered packing of the molecules, either on the microscopic scale (amorphous packing) or the macroscopic scale (grain boundaries). Once the molecules have been deposited into a crystalline structure, correction of these imperfections is difficult and energy-intensive. For example, crystalline organic semiconductors can have good mobilities, but are very difficult to process. Thus, all the previous organic semiconductor materials are intrinsically at a disadvantage. Charge carrier mobility, which is one determinant of solar cell efficiency, is lowered by several orders of magnitude compared to that of inorganic materials. For very well aligned organic samples the charge carrier mobility is as high as 5 cm$^2$/Vs, which is comparable to that of amorphous silicon but nowhere near as high as that of monocrystalline silicon typically at about 1400 cm$^2$/Vs. However, most organic samples are not as well aligned and typically have mobilities on the order of $10^{-4}$ cm$^2$/Vs. Prior to the present disclosure, organic samples with the best charge carrier mobilities needed to be put through purification processes almost as energy-intensive as those for inorganic materials, if not more so.

The reason that defects lower the charge carrier mobility is that in order to travel across a sample, the charge carriers must be able to hop from molecule to molecule. This works best if all the molecules are packed uniformly, with no dislocations from one region to the next. The π electron systems of each molecule must interact sufficiently to allow an exciton, electron or a hole to be passed from one molecule to another. In amorphous materials or at crystal domain boundaries, this is not the case and so charge transport is hindered.

Liquid crystalline materials offer an elegant solution to this problem. If a semiconducting material can be heated into a low viscosity liquid crystalline phase, it can self-heal into a structure with few defects and with the desired alignment. This well ordered phase can then ideally be cooled back to a crystalline state at room temperature, with the microscopic structure intact. The liquid crystalline phase itself does not typically have high charge carrier mobility, since the planar orientation and position of a molecule relative to its nearest neighbor is not fixed. However, it affords the possibility of transferring its order to a very well-aligned and potentially monocrystalline material, with far simpler processing than monocrystalline inorganics.

Generally, it is the rigid, aromatic core of the mesogen molecules that allows charge transport. Any phase that exhibits π-π stacking between the cores of adjacent molecules should theoretically be a viable material for charge transport. For crystals based on discotic phases (phases comprised of stacks of disc-shaped molecules), charge transport only happens along each stack. This leads to conductivity in only one dimension with the stacks being insulated from each other by the flexible, nonaromatic tails around the edge of each disc. Small defects in crystal structure can easily disrupt an individual column and prevent it from conducting. For this reason, crystals based on calamitic (rod like) phases have a distinct advantage over the discotic phases. They can conduct in two dimensions within each smectic layer, so they are not so vulnerable to disruption of charge transport. However, in order to conduct between the two plates, or conductors, bounding the cell, as would be required in a photovoltaic device, the layers must be aligned perpendicular to the surface rather than parallel. The perpendicular alignment means that the conductive cores are in direct contact with the substrate.

As noted above, the π-π stacking and charge carrier mobility of the mesophase are usually low because neither the position of a molecule relative to its nearest neighbor nor its rotational orientation is fixed. It is for this reason that calamitics are typically represented as rods, even though the molecules themselves may be more board-shaped. They rotate so freely (typically on the order of $10^{11}$ times per second) that they are best represented as long objects with only one anisotropic axis.

In the case of some oligothiophene doped polymers, the removal of some electrons from the valence band allows the remaining electrons to move freely, acting more like a conductor. For the purposes of photovoltaic materials, this doping is not necessary, as conductive behavior is not desirable. Since the side groups of oligothiophenes are readily substituted, the electronic properties of the molecules are readily modified. There are two types of position on the thiophene ring: the α positions next to the sulfur, and the β positions further away from it. Both of these positions can be selectively modified during synthesis of the B4 bent-core NOBOW molecules and W513 molecules of the present disclosure in order to engineer OPVs and organic semiconductors to have advantageous properties over pre-existing compositions and devices.

Any motion of free carriers in a semiconductor leads to a current, a transport mechanism. This motion can be caused by an electric field due to an externally applied voltage, since the carriers are charged particles. Carrier drift is such a transport mechanism. In addition, carriers also move from regions where the carrier density is high to regions where the carrier density is low. This carrier transport mechanism is due to the thermal energy and the associated random motion of the carriers, also known as carrier diffusion. The total current in a semiconductor equals the sum of the drift and the diffusion current.

Photovoltaic cells are generally constructed of conductors sandwiching various combinations of semiconducting materials. The band gaps of the semiconducting materials should correspond to the energies of incident infrared, visible or even UV light. Generally, there are three types of photovoltaic cell configurations. Photovoltaic cells of the present disclosure may be any one or any combination of the following general types.

Single layer organic photovoltaic cells are the simplest form among various organic photovoltaic cells. These cells are made by sandwiching a layer of organic electronic materials between two metallic conductors, typically a layer of indium tin oxide (ITO) with high work function and a layer of low work function metal such as Al, Mg or Ca. The difference of work function between the two conductors sets up an electric field in the organic layer. When the organic layer absorbs light, electrons will be excited to the LUMO and leave holes in the HOMO, thus forming excitons. The potential created by the different work functions helps to separate the exciton pairs, pulling electrons to the positive electrode (an electrode being an electrical conductor used to make contact with a nonmetallic part of a circuit) and holes to the negative electrode. The current and voltage resulting from this process can be used to do work. Using electric fields is not the best way to break up excitons, heterojunction based cells which rely on local highly effective fields are more effective.

Bilayer organic photovoltaic cells contain two different layers in between the conductive electrodes. These two layers of materials have differences in electron affinity and ionization energy, therefore electrostatic forces are generated at the interface between the two layers. The materials are chosen properly to make the differences large enough, so these local electric fields are strong, which may break up the excitons much more efficiently than the single layer photovoltaic cells do. The layer with higher electron affinity and ionization potential is the electron acceptor, and the other layer is the electron donor. This structure is also called a planar donor-acceptor heterojunction.

In bulk heterojunction photovoltaic cells, the electron donor and acceptor are mixed together forming a polymer blend. If the length scale of the blend is similar with the exciton diffusion length, most of the excitons generated in either material may reach the interface where excitons will break apart efficiently. Electrons move to the acceptor domains then are carried through the device and collected by one electrode. Holes are pulled in the opposite direction and collected at the other side.

One skilled in the art can also envision multiple layered cells in various dimensional arrangements to one another that can be used to create new organic photovoltaic cells. In one embodiment of the present disclosure, the organic photovoltaic cells are combined to form panels.

Carrier mobility studies as well as ultra-fast spectroscopic measurements of the semiconducting properties may be carried out on the semiconducting B4 phases of molecules of the present disclosure in order to characterize the new molecules. The carrier mobility studies may show high mobilities and fast, efficient charge separation. The B4 materials could be designed to optimize band gaps to capture light across the solar spectrum. In one aspect of the present disclosure, methods for swelling the B4 nanorod phase with acceptor phases could be used. These acceptor phases could be composed of molecules such as fullerenes and other molecules that selectively absorb visible, infrared or ultraviolet radiation and thus create excitons, holes or generally lead to a flow of a current. Alternatively, grafting acceptors onto the bent-core tails covalently could form the basis of nano structured solar cells creating even more efficient OPVs.

Thus, new organic semiconductors and compounds for use in OPVs and materials designed to form the B4 LC phase may be prepared according to the present disclosure. Characterization of the materials can be accomplished through nuclear magnetic resonance spectroscopy, x-ray diffraction spectroscopy, polarized light microscopy, differential scanning calorimetry, FFTEM, AFM, measuring charge carrier mobilities, theoretical modeling as well as ultra-fast spectrographic techniques, among others.

It is an object of the present disclosure to provide OPVs with improved photovoltaic performance. To this end, the disclosure provides for methods and compositions for organic semiconductors and OPV devices capable of operating with a high external quantum efficiency.

Another object of the present disclosure is to provide organic photosensitive optoelectronic devices with improved absorption of incident radiation.

DETAILED DESCRIPTION

Figure 1:
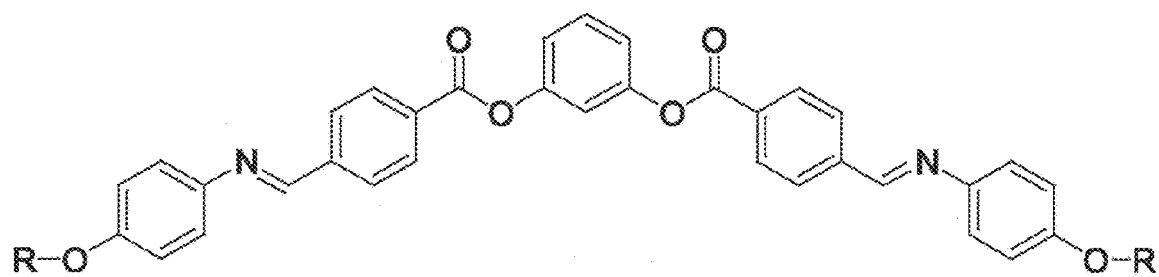
FIG. 1 shows structure of molecules referred to herein as the NOBOW class of molecules.
Figure 2:
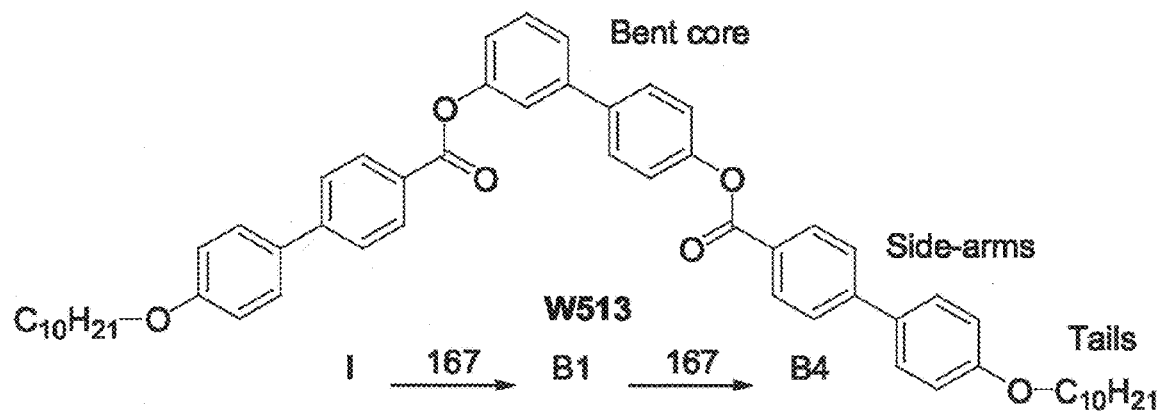
FIG. 2 shows structure of molecules referred to herein as the W513 class of molecules.
Figure 3:
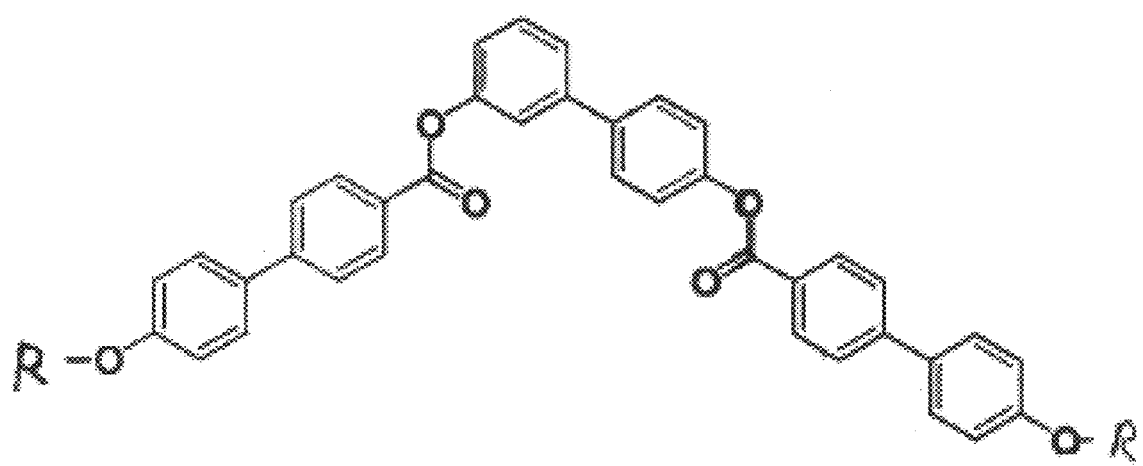
FIG. 3 shows structure for molecules referred to herein as the W513 class of molecules.
Figures 4, 4A, 4B, 4C:
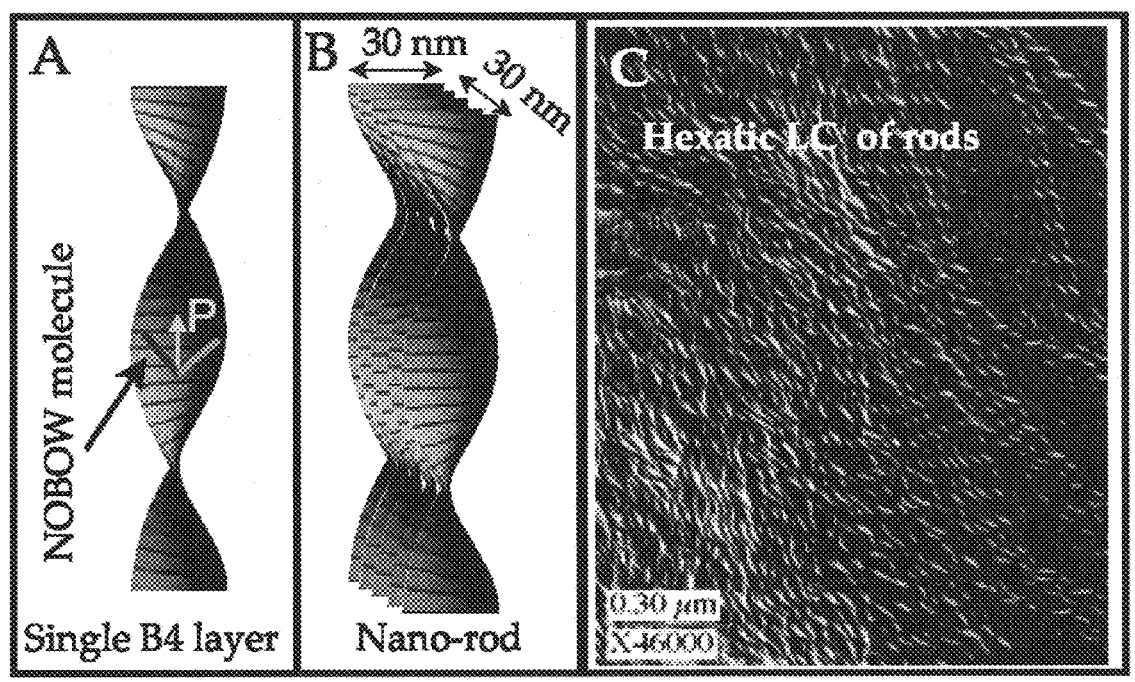
FIGS. 4A, 4B and 4C respectively show bent-core liquid crystal molecules in the B4 subphase.

The present disclosure provides prophetic examples of molecules that may be used for the manufacturing of improved organic photovoltaic cells that provide enhanced solar conversion efficiency while facilitating the manufacture of high efficiency, inexpensive, and flexible organic solar cells and organic semiconductors. Preferably, such cells would address the problem of recombination at the heterojunction interface while utilizing readily available and inexpensive materials that can be processed utilizing relatively well-known manufacturing techniques. The polymer layers of the present disclosure may be fabricated using vacuum deposition, spin coating, organic vapor-phase deposition, inkjet printing and other methods known in the art. The polymers of the present disclosure may advantageously be used for flexible electronics, organic semiconductors, organic photovoltaics, improved liquid crystal displays, electrooptical devices, photoelectric devices, photooptical devices, coatings for improved lenses, among other uses.

The present disclosure provides prophetic examples of molecules that may be useful for providing new p-type as well as new n-type materials. Such molecules may be useful for creating new p-n heterojunctions or other kinds of heterojunctions.

The organic photosensitive optoelectronic devices of the present disclosure may function as a solar cell, photodetector or photocell. Whenever the organic photosensitive optoelectronic devices of the present disclosure function as solar cells, the materials used in the photoconductive organic layers and the thicknesses thereof may be selected, for example, to optimize the external quantum efficiency of the device. Whenever the organic photosensitive optoelectronic devices or OPV devices of the present disclosure function as photodetectors or photocells, the materials used in the photoconductive organic layers and the thicknesses thereof may be selected, for example, to maximize the sensitivity of the device to desired spectral regions.

Each subcell of the stacked devices of the present disclosure may be comprised of an acceptor material and a donor material which could act as a heterojunction. The electrodes used in the organic semiconductors and OPVs of the present disclosure can be selected from any of those well-known in the art. In a preferred embodiment of the present disclosure, the electrodes attached to each subcell can be calcium or indium tin oxide. In a preferred embodiment of the present disclosure, the donor material has an ionization potential that is smaller than that of the acceptor material. In a further embodiment, the ionization potential HOMO/LUMO gap of the donor layer must be smaller than that of the acceptor layer. Generally, the materials comprising the donor or acceptor layers should have the longest possible exciton diffusion length, and thus are preferably those materials which lend themselves to ordered stacking of the molecules, such as planar, aromatic molecules. The acceptor material may be comprised of, for example, perylenes, naphthalenes, fullerenes or nanotubules, among others.

The materials selected for the contact layers or substrates may be nearly any useful contact materials well known in the semiconductor and solar cell industry. In many embodiments, the substrate is formed so as to be flexible which can be achieved using relatively thin substrates of materials such as aluminum, stainless steel, ITO or ITO on a polymer, and the like. In some cases, one contact is a reflector, such as aluminum, with the other contact allowing sunlight to pass freely, i.e., is transparent, such as ITO. In other cases, it is preferable that the materials selected for both contacts as well as the semiconductor crystals selected be transparent or at least partially transparent.

The organic polymers of the present disclosure may be made using any number of known or predictive techniques in the field such as the following presented by example:

General Methods

Commercially available reagents were used as purchased without further purification unless otherwise noted. Tetrahydrofuran (THF) was purified by distillation from a sodium/benzophenone ketyl still under an argon atmosphere prior to use. All nonaqueous reactions were performed in oven-dried glassware under an atmosphere of dry argon unless otherwise noted. All aqueous solutions used for reaction work up were saturated unless otherwise noted. Microwave reactions were performed in a MutiSYNTH microwave reactor, in a 70 mL reaction vessel.

All flash chromatography was performed either with silica gel (40-63 microns, 230-400 mesh) purchased from Silicycle, or with alumina gel (80-200 mesh) purchased from Fisher. Analytical thin-layer chromatography (TLC) was performed on either Silica G TLC plates and visualized w/ultraviolet (UV) light, the TLC plates having a thickness of 200 µm, purchased from Sorbent Technologies, or on Alumina TLC plates w/UV with a thickness of 200 µm, purchased from Sorbent Technologies. Compounds were visualized with short-wave UV, or by staining with I2, panisaldehyde, or vanillin. If either of the latter two stains were used, the plate was heated to visualize spots.

New compounds in the synthetic route were routinely characterized by NMR spectroscopy. $^1$H and $^{13}$C NMR spectra were recorded using a Varian Unity INOVA-500, a Bruker AM-400 spectrometer, or a Bruker 300 UltraShield. $^1$H NMR spectra are reported in parts per million (δ) relative to residual solvent peaks (7.24 for $CDCl_3$ and 3.58 for the downfield peak of d8-THF). $^{13}$C NMR spectra are reported in parts per million (δ) relative to residual solvent peaks (77.23 for $CDCl_3$ and 67.57 for the downfield peak of d8-THF). In the case of fluorinated compounds, $^{13}$C NMR spectra were performed first with normal carbon-proton decoupling to obtain singlet peaks for most of the protonated carbons, and then with carbon-fluorine decoupling to obtain singlet peaks for most of the fluorinated carbons. Broadband $^{19}$F decoupling was achieved via the adiabatic WURST2 decoupling pulse scheme. The decoupling scheme utilized a maximum decoupling field (gamma*B1) of 4.4 KHz with an RMS B1 field of 2.6 KHz, covering a bandwidth of >25,000.

For the mesogenic materials, phase transition temperatures were determined by differential scanning calorimetry using a Mettler Toledo DSC823e. Liquid crystal phases were determined by polarized light microscopy using a Nicon-HCS400 microscope with an Instec STC200 temperature-controlled stage. X-ray experiments were temperature controlled with an Instec STC200 hotstage, and data were collected using a point detector mounted on a Huber four-circle goniometer at either of the following: Synchrotron radiation at beamline X10A of the National Synchrotron Light Source (NSLS), Brookhaven National Laboratory, or Cu K(R) radiation from a Rigaku UltraX-18 rotating anode generator, operated by the Liquid Crystal Materials Research Center, University of Colorado-Boulder.

General Synthesis of Bent-Core Materials

In an argon-purged flask with constant stirring, 2.1 equivalents of the 4'-alkoxybiphenyl-4-carboxylic acid were dissolved in 6 mL of a 1:1 mixture of THF and $CH_2Cl_2$. To this mixture were added 1-ethyl-3-(3-dimethylaminopropyl)carbodiimide (EDCI) and 4-dimethylaminopyridine (DMAP). After two minutes, biphenyl-3,4'-diol was added. The reaction proceeded at room temperature for 16 hours, and was then examined by thin-layer chromatography. In the case of the shorter-tailed analogues, the reaction was complete at this point. The longer-tailed, less soluble analogues required a further 24 hours to reach an acceptable conversion. Upon completion, the reaction was deposited onto silica by rotary evaporation and columned in chloroform. The resultant solid was recrystallized twice from ethanol to yield a crystalline white solid.

Synthesis of Oligothiophenes

For this family of compounds, the core and tail units were synthesized individually and then coupled at the last step. For ease of labeling, each target molecule was abbreviated with a code name consisting of the total number of thiophene rings followed by the type of tail. For instance, the product with three rings and a decyl tail was named 3.10, the product with five rings and a [4.2.2] tail was named 5.[4.2.2], and the product with six rings and the branched 2-octyl tail was named 6.2-oct.

To make the tail units, the first step was to reduce the commercially available 5-bromo-thiophene-2-carbaldehyde to the corresponding alcohol with sodium borohydride. This molecule was slowly oxidized by air and needed to be kept in the freezer to remain useful. From there, one of two different methods was used to attach the tail. In the case of the n-alkyl tails, a simple Williamson ether synthesis on the alkyl halide was enough to attach the tail, with a yield of about 50%. This method was attempted on the fluoroether triflates, but this reaction produced a black tar with roughly a dozen spots visible in TLC each time. With this in mind, a number of different routes were tried.

As a second potential route, the thiophene alcohol was exposed to triflic anhydride in an attempt to convert it to the triflate, but again it gave only a gritty black tar. A third attempt used tosyl chloride in an attempt to tosylate the alcohol, upon columning, this produced a pale yellow oil that looked promising, but only gave a 1.5% yield for the reaction and was very impure by NMR. The fourth attempted route involved a Mitsunobu coupling. This reaction requires that the more acidic alcohol have a pKa of 15 or below. The thiophene alcohol was predicted to have a pKa of 13.88 so the reaction was expected to work. However, TLC at 24, 48 and 72 hours showed no change in the composition of the reaction mixture. A fifth route was tried involving converting the thiophene alcohol to its trichloroacetimidate. This finally gave a pure product, albeit at low yield. The trichloroacetimidate was reacted with the alcohols of the two fluoroethers and racemic 2-octanol to give the desired end units. The yield for both production of the trichloroacetimidate and its coupling were around 50%.

It is not understood why the thiophene alcohol is so reluctant to attach to the tails. It could be related to the ease with which it is air-oxidized. However, the starting materials were commercially available and inexpensive, so the reactions were done on large enough scales to overcome this problem. To make the core units, the commercially available bithiophene, terthiophene, or quaterthiophene was stannylated with butyllithium and tributyl tin chloride. On the first attempts the reaction appeared to work, but the product decomposed on the silica used for TLC and column chromatography. Once alumina was used instead for both of these methods, the isolation of these stannanes proceeded smoothly and with good yield to give the bis(tributylstannyl)oligothiophene. The single-ring bis(tributylstannyl)thiophene was commercially available from Sigma Aldrich and did not need to be synthesized.

To couple the tail units to the core unit, Stille coupling was used. Initially a traditional thermal Stille was performed by refluxing the reagents in DMF overnight, but the yields produced by this method were at most 30%, and typically lower. However, the use of a microwave reactor is known to dramatically reduce reaction times and increase yields for Stille and other couplings. Once a microwave reactor became available, the reactions were performed via this method instead. By heating the reactants to 200° C. in chlorobenzene, the average reaction time was lowered to 15 minutes and the yield increased to 45%-60%. Solubility varied widely depending on the number of rings in the final molecule, so the terthiophene (three-ring) products and quaterthiophene (four-ring) products were purified by first columning in 1:1 chloroform:hexanes, then recrystallizing from hexanes. The quinquethiophene (five-ring) products were purified by recrystallization from larger amounts of hexanes, and the very insoluble sexithiophene (six-ring) products could only be recrystallized from chloroform.

The materials produced varied in appearance and phase transitions, but the biggest determinant of properties was the number of rings in the core. For instance, the n-alkyl tailed compounds had similar phase transitions to other compounds with similar core structures. The color of the compounds was also determined by core size with the 3-, 4-, 5-, and 6-ringed compounds being pale yellow oils, yellow solids, orange solids, and red-orange solids, respectively.

Since these colors indicate adsorption of violet through blue-green light, the band gap of each series likely varies from around 2.5 to 3 eV, which is a little on the high side but comparable to that of other photovoltaic materials, other such colors could be created for many different OPV preferred band gaps.

There is a correlation between number of rings and transition temperatures. The four-ring compounds do not exhibit mesophases, while the five- and six-ring compounds pass through smectics at progressively higher temperatures. The three-ring compounds are isotropic at room temperature and therefore not of use for LC OPV applications, so their phase transitions were not measured.

General Synthesis of n-alkyl-tailed Bromothiophenes (5-Bromo-thiophen-2-yl)-methanol was dissolved in 8 mL dry THF. 1.6 equivalents of NaH (60 wt % in oil) were added slowly over the course of 5 minutes and the mixture was stirred for 20 minutes. A solution of two equivalents of the relevant alkyl halide in 11 mL THF was added, and the reaction was refluxed for 16 hours. After cooling, the reaction was quenched with 10 mL of a 9:1 acetone:$H_2O$ mixture. The mixture was dried with $MgSO_4$, filtered, and concentrated by rotary evaporation to yield a dark brown oil. This crude product was purified by column chromatography in 1:1 $CHCl_3$:hexanes to yield the product as a yellow oil.

General Synthesis of Fluoroether-tailed or Branched-alkyl-tailed Bromothiophenes Semipure (5-bromo-thiophen-2-yl)-methyl-2,2,2-trichloroacetimidate was mixed with 0.15 equivalents of pyridinium p-toluenesulfonate, 2 equivalents of the relevant alcohol, and 20 mL of $CH_2Cl_2$. This mixture was stirred at room temperature for 48 hours under nitrogen. The reaction was then concentrated by rotary evaporation and purified by column chromatography in 9:1 hexanes:ethyl acetate to yield the product as a yellow oil.

General Synthesis of bis(tributylstannyl) Oligothiophenes

The relevant oligothiophene was dissolved in THF and cooled to −78° C. 2.1 equivalents of n-BuLi (1.6M in hexanes) were added dropwise. The mixture was allowed to warm to RT and stirred for an hour. 2.1 equivalents of tributyl tin chloride were added and the reaction was refluxed for 1 hour, during this time it turned brown and cloudy. n-Hexanes was added to the mixture, and it was allowed to cool to RT. The mixture was washed with aqueous $NaHCO_3$ (2×75 mL), dried over $MgSO_4$, and concentrated by rotary evaporation. The crude product was purified by column chromatography in pure hexanes on alumina to yield the product as an oil (pale yellow for n=2, through very dark yellow for n=4).

Characterization of OPVs

Time-of-flight is a common method for determining charge carrier mobility. The samples could be put through the steps wherein a thin layer is coaled onto a substrate and then annealed by heating into the available liquid crystal phases. If these samples prove to have acceptable charge carrier mobilities, either before or after this alignment step, then further work could be done in investigating their use as photovoltaic materials.

Electronic properties such as ionisation potential can be characterized by probing the electronic band structure with ultraviolet photoelectron spectroscopy (UPS). Charge-carrier transport properties of organic semiconductors can be studied by a number of techniques. For example, time-of-flight (TOF) and space charge limited current techniques are used to characterize "bulk" conduction properties of organic films. Organic field effect transistor (OFET) characterization technique is probing "interfacial" properties of semiconductor films and allows to study the charge carrier mobility, transistor threshold voltage and other FET parameters. OFETs development can directly lead to novel device applications such as organic-based flexible circuits, printable radio frequency identification tags (RFID) and active matrix backplanes for displays. Chemical composition and structure of organic semiconductors can be characterized by infrared spectroscopy, secondary ion mass spectrometry (SIMS) and X-ray photoelectron spectroscopy (XPS).

General Synthesis of Tailed Terthiophenes 2,5-Bis(tributylstannyl)thiophene was mixed with 2.05 equivalents of the relevant tail unit and chlorobenzene (10 mL) in a 20 mL vial. This solution was subjected twice to a vacuum-argon cycle, then sparged with argon for an additional 10 min. Tetrakis(triphenylphosphine) palladium was placed in a 70 mL microwave reaction vessel, and the vessel was flushed with argon. The reactant solution was transferred by syringe and the vessel was sealed. It was placed in the microwave reactor and heated to 200° C. for 20 minutes. The resulting product was purified by column chromatography in $CHCl_3$ to yield the product as a yellow oil. Other oligothiophenes were synthesized using the above general scheme with appropriate substitutions.

General Synthesis of Fluoroether Triflates

These tails were commercially available from Exfluor Research Corporation as the alcohol—either 1H,1H-perfluoro-3,6-dioxadecan-1-ol (abbreviated as [4.2.2]OH), or 1H,1H-perfluoro-3,6,9-trioxamidecan-1-ol (abbreviated as [4.2.2.2]OH). The relevant alcohol was dissolved in 45 mL $CH_2Cl_2$. The reaction was cooled to 0° C. in an ice bath, and triflic anhydride was added dropwise, followed by pyridine. The reaction was stirred at 0° C. for 1.5 hours and then at room temperature for 16 hours. This reaction was then diluted with 50 mL $CH_2Cl_2$, placed in a separatory funnel with several pieces of ice and washed with ice water, then with chilled 3% sulfuric acid, and then with ice water again. The organic layer was dried over sodium sulfate and concentrated under vacuum to a viscous, clear oil, which was kept in a freezer until use.

General Synthesis of n-alkyl-tailed Methyl Esters

4'-Hydroxy-biphenyl-4-carboxylic acid methyl ester was dissolved in 75 mL dry acetone. Anhydrous potassium carbonate and anhydrous cesium carbonate were added and allowed to stir for five minutes, producing a yellow solution as the carboxylic acid dissolved and was deprotonated. 1.5 equivalents of the relevant alkyl bromide were added and the reaction was heated to reflux for 72 hours, with additional acetone added as needed. The reaction was cooled and filtered, with further acetone washings. The filtrate was coated onto silica by rotary evaporation and purified by column chromatography in chloroform to yield a white solid.

General Synthesis of Fluoroether-tailed Methyl Esters

4'-Hydroxy-biphenyl-4-carboxylic acid methyl ester was dissolved in 40 mL dry acetone. Anhydrous potassium carbonate and anhydrous cesium carbonate were added and allowed to stir for five minutes, producing a yellow solution as the carboxylic acid dissolved and was deprotonated. 0.9 equivalents of the relevant fluoroether triflate were added and the reaction was heated to reflux for 72 hours. The reaction was cooled and filtered, with further acetone washings. The filtrate was coated onto silica by rotary evaporation and purified by column chromatography in chloroform. The resultant solid was recrystallized from ethanol to yield a crystalline white solid.

General Synthesis of Chiral Branch-tailed Methyl Esters 50 mL of anhydrous THF were added to an argon-purged flask. To this flask were added 4'-hydroxy-biphenyl-4-carboxylic acid methyl ester 1.1 equivalents of the relevant (S)-2-alcohol, and triphenylphosphine (TPP). After two minutes, diethyl azodicarboxylate (DEAD) was added to the mixture. The reaction was stirred at room temperature overnight, then coated onto silica by rotary evaporation and columned in chloroform. The resultant solid was recrystallized from ethanol to yield a crystalline white solid.

General Synthesis of Tailed Carboxylic Acids

The 4'-alkoxy-biphenyl-4-carboxylic acid methyl ester was dissolved in 20 mL of a 1:1 mixture of water and THF. 10 equivalents of lithium hydroxide monohydrate were added and the reaction was stirred at reflux for 16 hours. After cooling, the reaction was brought to a pH of 2 by dropwise addition of HCl, causing the product to precipitate out. The resulting solid was filtered, washed with water, and recrystallized from ethanol to yield a crystalline white solid.

The above examples of prophetic organic polymers or polymers synthesized using the above predictive examples may be used to make organic semiconductors, OPVs or any other films. There are significant differences between the processing of small molecule organic semiconductors and semiconducting polymers. Thin films of soluble conjugated polymers may be prepared by solution processing methods. However, small molecules are quite often insoluble and typically require deposition via vacuum sublimation or using techniques such as chemical or molecular layer vapor deposition. Wet coating techniques require polymers to be dissolved in a volatile solvent, filtered and deposited onto a substrate. Common examples of solvent-based coating techniques include drop casting, spin-coating, doctor-blading, inkjet printing and screen printing. Spin-coating is a widely used technique for small area thin film production that may result in a high material loss. The doctor-blade technique has minimal material loss and may be useful, therefore, for large area thin film production. Vacuum based thermal deposition of small molecules requires evaporation of molecules from a hot source. The evaporated molecules may then be transported through vacuum onto a substrate. Condensation of these molecules on the substrate surface results in thin film formation. Wet coating techniques may be applied to small molecules, depending on material solubility.

The above organic polymers may be swelled with an appropriate liquid crystal such as 8-cyanobiphenyl. The organic polymers may swell up to 20% by weight before bulk phase separation occurs. Acceptors may be included within the swelling liquid crystal. For example, the Buckminster fullerene acceptor may be added to the LC polymer by adding a slurry of the fullerene to the B4 material. This slurry will swell the B4 material. These acceptors may integrate with the B4 LCs to create OPVs and other semiconducting materials.

Alternatively, to a layer of LCs of bent-core molecules such as the NOBOW class, the oligothiophene class and the W513 class, acceptor molecules such as fullerenes, for example, may be deposited via vapor phase deposition or a liquid phase deposition. If the deposition is via a liquid phase, the solvent that the acceptors are dissolved within a liquid phase which could then be evaporated from the LC leaving the semiconducting or OPV containing a heterojunction of p-type and n-type layers.

In one embodiment of the present disclosure, the organic semiconductors and/or OPVs are deposited upon or within a suitable conductor. Within this system may be placed electrodes, conductors and other circuitry which may comprise a semiconducting or OPV device. Such OPVs and organic semiconductors of an embodiment of the present disclosure could have superior quantum efficiencies as well as other superior properties due to the new heterojunctions that are possible with using LCs of the present disclosure.

OPVs and semiconductors of the present disclosure may be engineered to selectively capture photons or other energized particles whose energy correlates to the band gap of the LC B4 phased polymers of the present disclosure.

In a preferred embodiment of the present disclosure, the exciton, electron, hole or other charge carrier will travel through the π-π conjugated system of the mesogen.

In a preferred embodiment of the present disclosure, the charge carrier will travel along the molecules of the present disclosure until they cross a heterojunction and then cross into a conducting circuit.

In a preferred embodiment an exciton will be created through irradiating a fullerene at the proper wavelength, such as 440 nm, thus creating a charged particle that will enter the LC molecules, cross the heterojunction and enter a conductor to generate a current that may be useful for the purpose of powering an electronic device or being stored in a battery or capacitor as a potential source of energy or power.

In an advantageous preferred embodiment of the present disclosure, the large surface area of donators (mesogens) to acceptors (fullerenes, for example) will deliver increased quantum efficiencies of the semiconductor or OPV in which they may be used.

In yet another preferred embodiment, the B4 subphased LCs of the present disclosure may be embedded within or exposed to a conductor in an orientation such that the rope-like structure, for example, has increased contact with a conductor that will accept the charge carriers from the LC bent-core donor/acceptor molecules.

In another preferred embodiment of the present disclosure, the LC nature of the B4 molecules may help to heal any discontinuities in the charge carrying structure of the OPV or organic semiconductor due to the ability of LCs to translate and thus heal the gap or loss of a molecule needed to transmit the electrons, exitons, holes or other charge carriers.

In an embodiment of the present disclosure, transport of the charge carriers may happen through the mesogens and acceptors or through tunneling both along the polymer chains as well as between chains.

In yet another embodiment of the present disclosure, coatings made from polymers of the present disclosure may be used as coatings for lenses. The LC, B4 subphase bent-core molecules may be engineered to selectively allow degrees of transmission of particular wavelengths of light and/or energies of photons into the underlying material, such as a lens, for example. The underlying material may be a conductor or switch or any other electrical circuit that is well known in the art and that is in contact with a coated lens, for example.

WORKING EXAMPLES

Example 1

Study of Exciton Splitting at Heterojunctions Between Thin Films of Liquid Crystalline Helical Nanofilaments and Fullerenes Bulk heterojunction organic photovoltaics rely on the optimization of material energetics and morphologies. This work compares the charge generation efficiency of two self-assembling donor-acceptor architectures, namely, the highly ordered helical nanofilament (HNF) phase and a lamellar phase, formed by the same molecular components under different conditions.

Organic photovoltaics rely on many material parameters: efficient light absorption to create a reactive excited state, movement of the excited state towards the donor-acceptor interface, electron transfer at that interface, and movement of the charges to the electrodes. Each of these steps requires various electronic and morphological considerations. Exciton dissociation is believed to be a limiting step in this process. Exciton diffusion lengths in small molecules have been measured and used to define an optimal bulk heterojunction mixing distance of approximately 10-20 nm or more.

Several key features identify the B4 phase as a bulk heterojunction material. The B4 phase was initially identified in the P-n-OPIMB series, but has more recently been found in other bent-core liquid crystal mesogens. One dominant feature is that it forms HNF phase material comprised of crystalline smectic layers of small molecules extending in the x and y plane that stack in the z direction into blocks of 5-8 layers (~25-30 nm tall.) A crystallization-induced curvature in the layers forces a twist in the sheets, limiting their growth in the x direction to 25-30 nm, yet not inhibiting the growth in the y direction. This creates a structure with nano scale growth limitations in two directions and extended crystallization in the third direction. Another important feature of the HNF phase is its ability to "nano-entrain" other small molecules, as demonstrated by Chen et. al, allowing for nanoscale mixing of potential donor and acceptors. Additionally, the HNFs can be aligned through a variety of methods. This material has the potential to create a nano-separated yet highly ordered and alignable material for a self-assembling ordered heterojunction.

One molecule known to form the B4 phase, and thus HNFs, is P-9-OPIMB. Time-resolved microwave conductivity (TRMC) studies show that P-9-OPIMB acts as an electron acceptor when mixed with the soluble fullerene PCBM. The molecule P-9-OPIMB is unreactive with air and water.

Tunneling Electron Microscopy (TEM) and powder X-ray diffraction (XRD) were used to identify the structure of the D-A system. The structure was then correlated to a difference in total photo-induced electron transfer as measured by flash-photolysis. TRMC was used to probe photo-induced free charges in a donor-acceptor system.

By using the same donor and acceptor molecules it is possible to separate the frontier orbital energetics from morphology in the charge generation process. Through this it is possible to compare the HNF/fullerene system to a lamellar/fullerene system. The key morphology difference in these systems is the contact between the tails and cores of the molecule. PCBM and P-9-OPIMB organize into a HNF phase that allows for more efficient charge generation the same molecules in a lamellar morphology.

Sample Preparation and Characterization

P-9-OPIMB was synthesized as described above. PCBM was purchased from Sigma Aldrich. Solutions of P-9-OPIMB and PCBM were made in chloroform at concentrations of 15 g/L. Films were prepared by spin-coating solutions onto clean quartz substrates at 600 rpm for 60 s in a nitrogen-filled glove box. Films were annealed on a (type) hotplate for 5 minutes at annealing temperature under inert atmosphere and then stored in the dark. Dropcast films were made from 15 g/L P-9-OPIMB in chloroform in air. Spincoated film thickness was measured to be about 100 nm thick, using a profilometer. Absorption measurements for photoconductivity normalization were measured with a Shimadzu integrating sphere.

TEM

Samples on quartz were coated with Pt from an angle of 45, creating a shadowed replica of the samples surface. A layer of carbon was then deposited to add support to the Pt replica. The sample was then dissolved in ethyl acetate and the replica floated and mounted on a TEM grid.

Figure 5A:
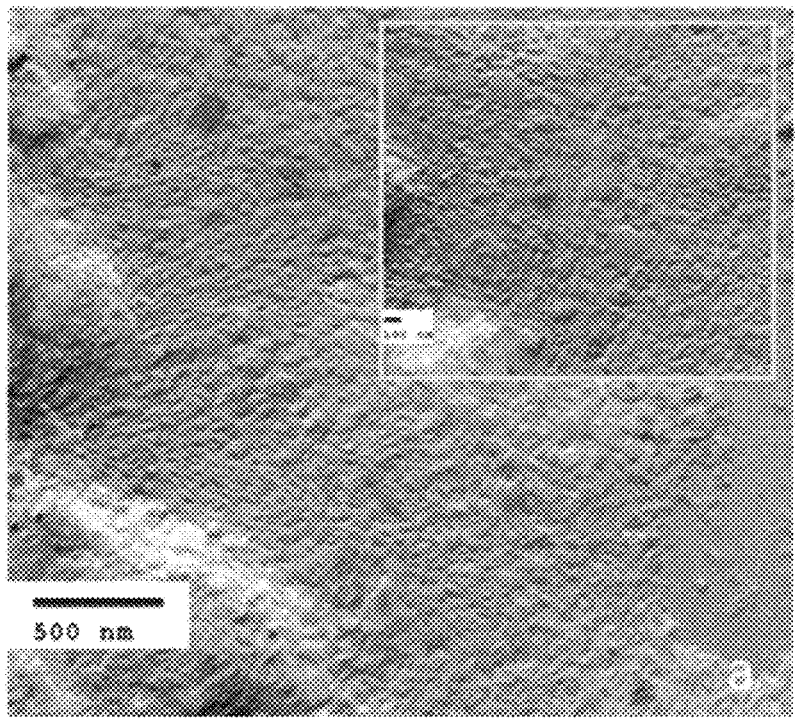
FIGS. 5A and 5B are TEM images showing comparative thin films of 50% PCBM in P-9-OPIMB.
Figure 5B:
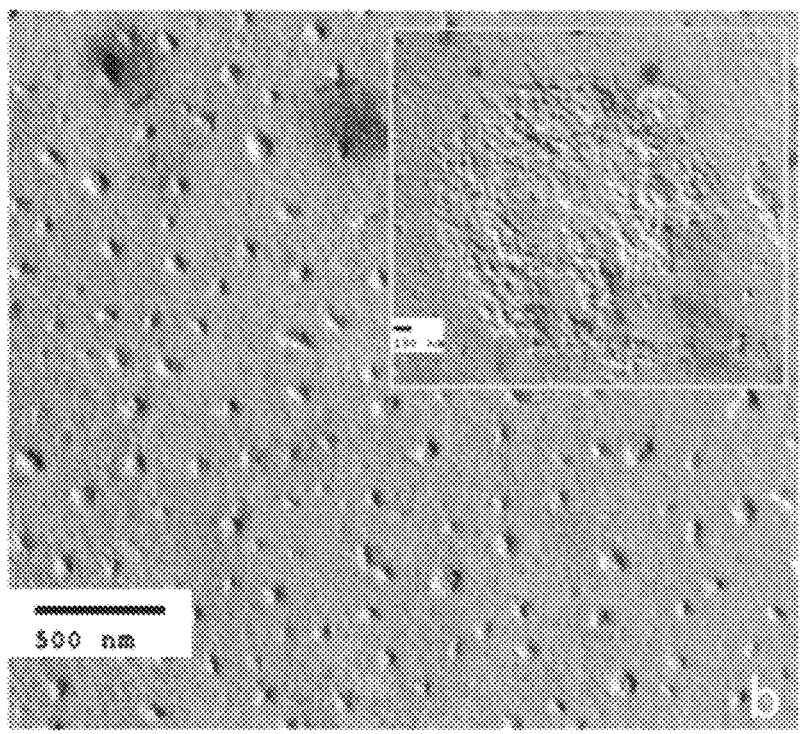

Although the liquid crystal phases of P-9-OPIMB have previously been well described, the majority of work has focused on P-9-OPIMB in a bulk phase. This work uses thin films of P-9-OPIMB and mixtures of P-9-OPIMB with PCBM. The creation of thin-films introduces more surface effects than would be present in the bulk, which may have a significant impact on the B4 structuring. Similarly, while P-9-OPIMB has previously been shown to form the B4 phase in mixtures with small molecules, it was desirable to verify that PCBM was not an exception to the rule. TEM to imaging of the samples confirmed that thin-films and PCBM doping do not disrupt the formation of the B4 phase. FIGS. 5A-5B compares TEM images of the as-cast sample to one annealed to 200 C (above the melting point of P-9-OPIMB.)

The TEM results identify the presence of the liquid crystal phase in the 50% PCBM in P-9-OPIMB thin-films. In FIG. 5A, the as-cast P-9-OPIMB-PCBM film shows HNFs, where the inset shows islands of lamellar packing on top of helical nanofilaments. FIG. 5B shows that the annealed film is completely flat, as demonstrates a lamellar phase with smectic layers oriented parallel to the air interface. A few small areas of the sample showed HNF packing just below the smooth surface, as shown in the inset.

As seen in FIGS. 5A-5B, the as-cast and annealed films show distinct and dissimilar textures. In the as-cast images (FIG. 5A), the sample shows the HNF phases known to form from neat P-9-OPIMB, yet these films are made from 50% by weight PCBM in P-9-OPIMB. Thus the liquid crystal phase appears unchanged even at such high levels of doping. Most prominent in the TEM images of the as-cast sample is the HNF phase, as identified in FIG. 5A. Spin-coating from a very high vapor pressure solvent (chloroform) has led to an uneven surface yet HNF texture can be seen across most of the sample topology. Several surface textures were present in the films to a lesser degree.

Annealed films show a lamellar texture, a less-common B4 phase, as seen in FIG. 5b. While the images of the as-cast film varied between HNF and other textures (with a small portion of the images showing lamellar), nearly the entire annealed sample showed lamellar textures. In one image, shown in FIG. 5B inset, it is possible to see a small area of HNF texture. One unusual feature of the annealed films is the presence of the ~50 nm protrusions from the lamellar surface, we have not identified the origin of these bumps.

The TEM data suggests that the as-cast films are forming the HNF phase and that the annealed films are being forced into a lamellar phase.

XRD

Samples were prepared as described above on quartz. Diffraction measurements were taken on a Rigaku d/max instrument which uses Copper K$\alpha$ radiation from a rotating anode.

While TEM is useful in characterizing layered textures, TEM only provides information about the top surface with TEM so X-ray diffraction was also used. X-ray diffraction probes the bulk effects of the entire sample, allowing us to determine whether the lamellar structure of the annealed sample is solely a surface effect or if it extends the entire thickness of the sample.

Figure 6:
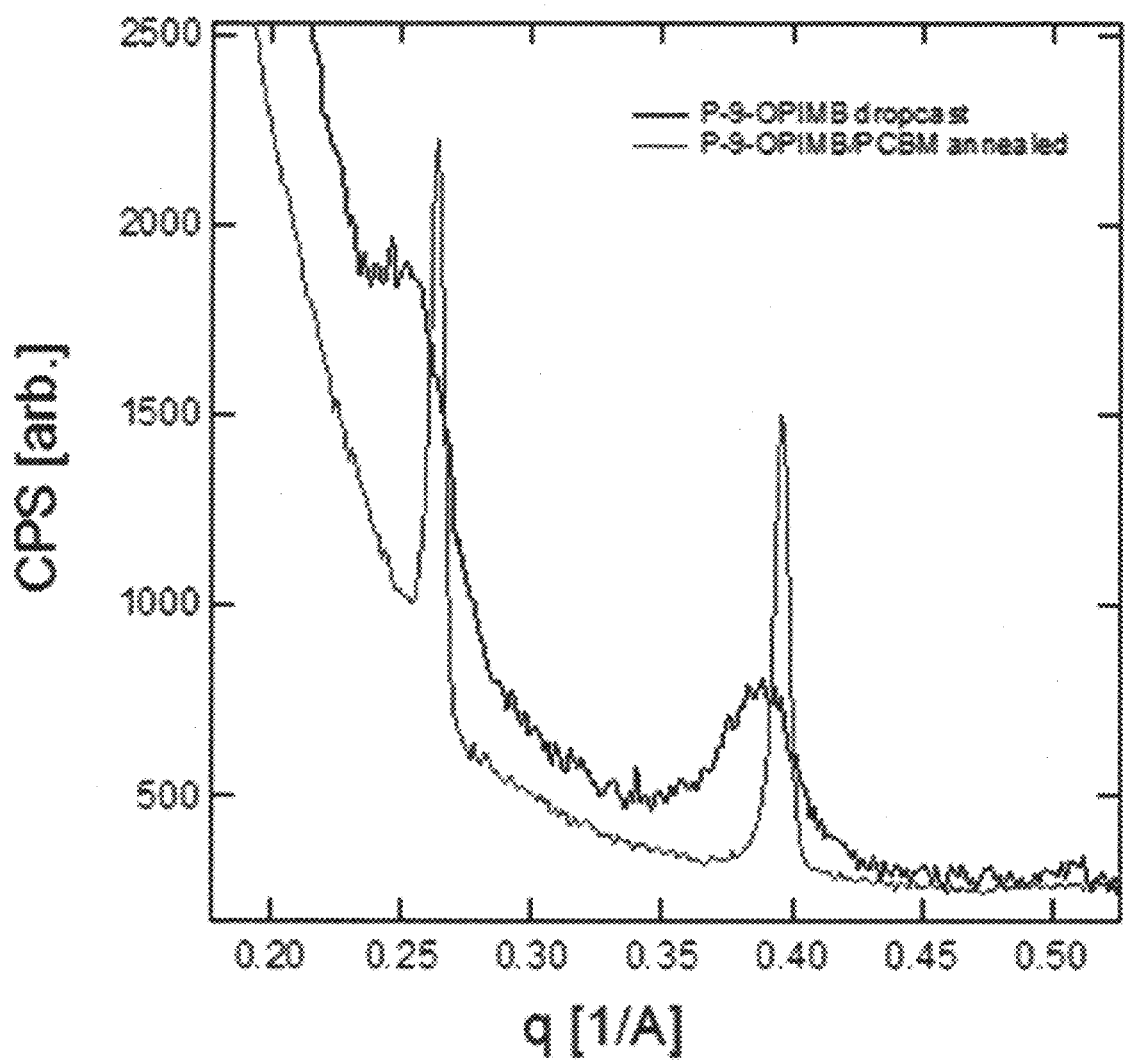
FIG. 6 is an X-ray diffractogram of P-9-OPIMB thin films.

The diffractogram in FIG. 6 shows the diffraction of a thin-film of dropcast P-9-OPIMB as compared to the annealed P-9-OPIMB/PCBM film. A neat drop cast film of P-9-OPIMB was selected to be representative of bulk P-9-OPIMB. The peak near 0.4 Å$^{-1}$ has previously been identified as the third harmonic peak of the smectic layer spacing of the HNFs, which we used to gauge whether a sample was forming HNFs. Typically, the interlayer peaks of the sample are between 1 Å$^{-1}$ and 2 Å$^{-1}$ which is masked in our samples by the background quartz substrate signal. This is also why we are not able to see PCBM crystallization peaks. As-cast PCBM/P-9-OPIMB film diffraction patterns show a very weak diffraction signal due to sample irregularity, recall the rough irregular surface from the TEM images. The dropcast film has a thickness advantage to the as-cast sample. An as-cast diffractogram has been included in the Supporting Information.

As can be seen in FIG. 6, the 3$^{rd}$ harmonic peak sharpness varies between the samples. The dropcast P-9-OPIMB film has a 3$^{rd}$ harmonic peak width at half height maximum. This peak width corresponds to the number of repeating smectic layers in the helical nanofilaments, 5-8 layers.

The annealed mixed film shows a much sharper diffraction peak than the neat P-9-OPIMB film. The 3$^{rd}$ harmonic peak width at half height for the PCMB/P-9-OPIMB film. corresponds to a longer diffraction coherence length, i.e. more smectic layers are stacked on top of each other. While the HNFs have a set diffraction peak width because of the limited smectic layer stacking growth, a lamellar smectic phase would not be similarly constrained.

The XRD results suggest that the mixed P-9-OPIMB/PCBM film may form HNFs but when annealed it changes to a lamellar film. Specifically, the diffraction spacing for the mixed film remained the same and smectic layer peak dramatically sharpened. This signifies that the same smectic layers are forming a more traditional lamellar-type phase instead of the HNFs.

TRMC

TRMC instrumentation and measurements have been extensively described elsewhere. The samples were measured in an air-filled resonant microwave chamber. A 5 ns laser pulse of 420 nm was generated from a OPO pumped with a Nd:YAG laser source. Microwave loss was recorded with an oscilloscope for 500 ns at varying intensities of light. Signal was normalized by light absorption and irradiance.

Understanding the morphology of the two samples facilitates comparison of charge generation rates with a possibility of correlating structure to charge transfer. In order to use this data, we assume that when light is absorbed by the sample some fraction of excited states diffuses to the D-A junction and a charge transfer occurs. Because the TRMC signal is a convolution of total charges and their mobility, it is often hard to interpret charge generation yields from the photocurrent transients. The mobility of localized charges in the TRMC microwave field may not directly correspond to other more macroscopic measurement techniques (TOF, TFT, CELIV, ect.) Additionally the mobility of the electrons in PCBM (the main carrier which we are probing with TRMC) may differ when present as a mixture with P-9-OPIMB from that of the neat measurement. The compared samples contain the exact same concentration of PCBM, with the same mobility, and thus the magnitude of the end-of-pulse peak can be used to quantify the relative efficiency of charge generation in the different morphologies.

Figure 7A:
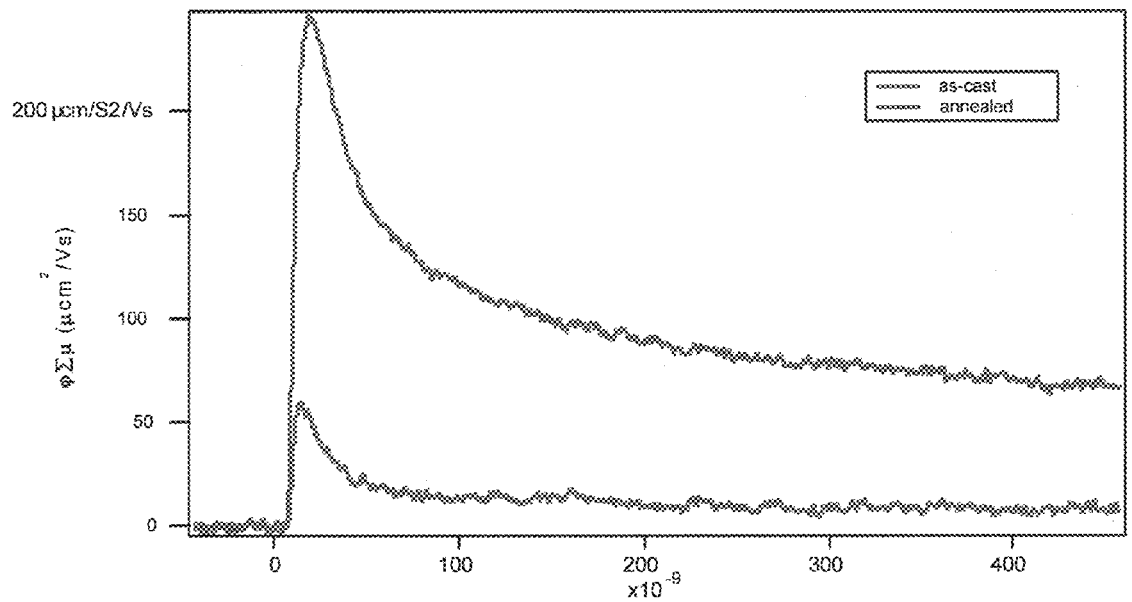
FIGS. 7A and 7B are TRMC photoconducitivity traces used to compare photo-induced charge transfer.
Figure 7B:
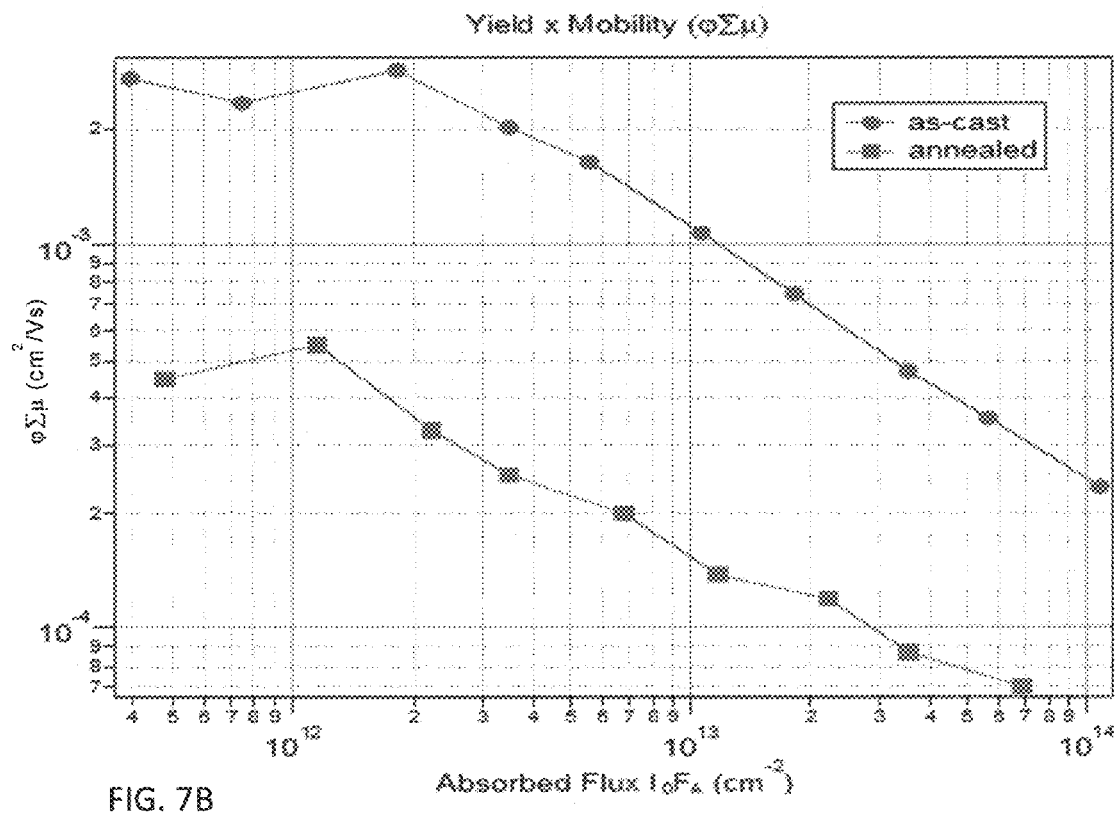

The photoconductivity plots in FIGS. 7A-B demonstrate the effect of annealing on total photo-induced charge transfer. The light absorption normalized signal is plotted versus time, extending through the first 400 ns. For this study the most important feature of the signal is the max peak height just after to, as this represents the point in which the greatest number of free charges have been created. After to the charges in the system may find traps and/or recombine and no longer contribute to the microwave loss signal, hence the signal decay. In FIG. 7A it is important to note that the as-cast signal is much larger than that of the annealed sample.

FIG. 7B, the yield x mobility plot, compares the annealed and as-cast films of 50/50 P-9-OPIMB/PCBM over a range of light intensities. $\phi\Sigma\mu$ is the peak maximum of the normalized photoconductivity signal. The powerful laser pulse used to excite the system results in a higher exciton density than would be found at a solar fluence. This leads to nonlinear recombination effects occurring faster than our instrument response time and resulting in a lower overall signal. This can be observed in the yield x mobility plot. Both samples have a maximum signal plateau in the range of 1012 photons/cm2. The annealed sample is nearly an order of magnitude lower in maximum signal than the as-cast 50/50 P-9-OPIMB/PCBM sample.

These results suggest that, for the same amount of photons impinging upon the structure, more free charges are generated in the helical nanofilament ordered system than in the lamellar geometry.

Figure 8:
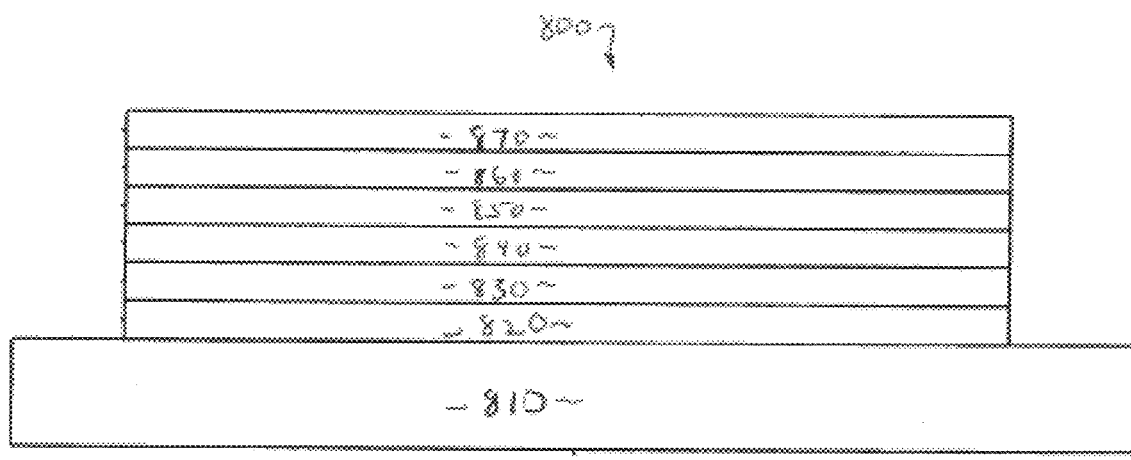
FIG. 8 shows an organic photovoltaic cell that utilizes a semiconducting layer made of organic crystal having B4 phase mesogens.

FIG. 8 shows an organic photosensitive optoelectronic device 800. The figure is not necessarily drawn to scale. Device 800 may include a substrate 810, an anode 820, an anode smoothing layer 830, a donor layer 840, an acceptor layer 850, a blocking layer 860, and a cathode 870. Device 800 may be fabricated by depositing the layers described, in order. Charge separation may occur predominantly at the organic heterojunction between donor layer 840 and acceptor layer 850. The built-in potential at the heterojunction is determined by the HOMO-LUMO energy level difference between the two materials contacting to form the heterojunction. The HOMO-LUMO gap offset between the donor and acceptor materials produce an electric field at the donor/acceptor interface that facilitates charge separation for excitons created within an exciton diffusion length of the interface. The general structure of the device is known to the art, for example k, as reported in U.S. Pat. No. 8,357,849 issue dot Peumans et al.; however, the present disclosure advances the art by further disclosing the use of a organic crystal material made of B4; phase mesogens as one of the donor layer 840 and the acceptor layer 850. The organic crystal material is preferably used as the donor layer 840.

The specific arrangement of layers illustrated in FIG. 8 is exemplary only, and is not intended to be limiting. For example, some of the layers (such as blocking layers) may be omitted. Other layers (such as reflective layers or additional acceptor and donor layers) may be added. The order of layers may be altered. Arrangements other than those specifically described may be used. The substrate may be any suitable substrate that provides desired structural properties. The substrate may be flexible or rigid, planar or non-planar. The substrate may be transparent, translucent or opaque. Plastic and glass are examples of preferred rigid substrate materials. Plastic and metal foils are examples of preferred flexible substrate materials. The material and thickness of the substrate may be chosen to obtain desired structural and optical properties.

Figure 9:
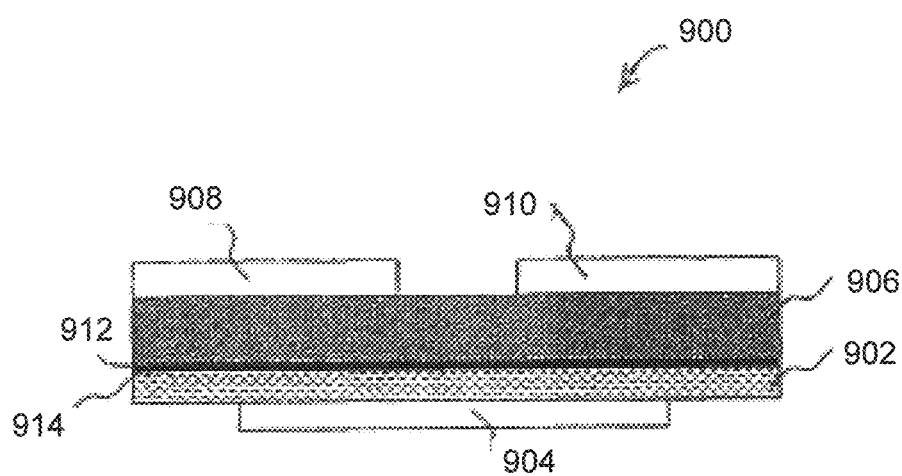
FIG. 9 shows an organic field effect transistor that utilizes a semiconducting layer made of organic crystal having B4 phase mesogens.

FIG. 9 shows a schematic illustration of an organic field-effect transistor 900 with a channel doping, where a dielectric layer 902 is formed on a gate electrode 904, the dielectric layer 902 electrical isolates the gate electrode 904 from an active layer 906 of organic material in which during operation an electric conducting channel is formed by means of the field effect. A source electrode 908 and a drain electrode 910 are formed above the active layer 906 of organic material. A dopant material layer 912 comprising a molecular dopant material is produced in the boundary region 914 between the dielectric layer 902 and the active layer 906 of organic material. The molecular dopant material 912 is an electrical dopant for the organic material of the active layer 906. The dopant material layer 912 provides a spatially defined doping in the active layer 906, so that impurities are saturated in the active layer 906. These impurities thus no longer hinder the current flow in the conducting channel in the active layer during operation of the organic field-effect transistor. The general structure of the organic field effect transistor 900 is know to the art, for example as reported in U.S. Pat. No. 8,212,041 9 issue dot Denker et al.; however the present disclosure advances the art by disclosing use of an organic crystal with B4 phase mesogens in place of the active layer 906. The dopant layer 912 may be, for example, an n or p-doped fullerene.

Figure 10:
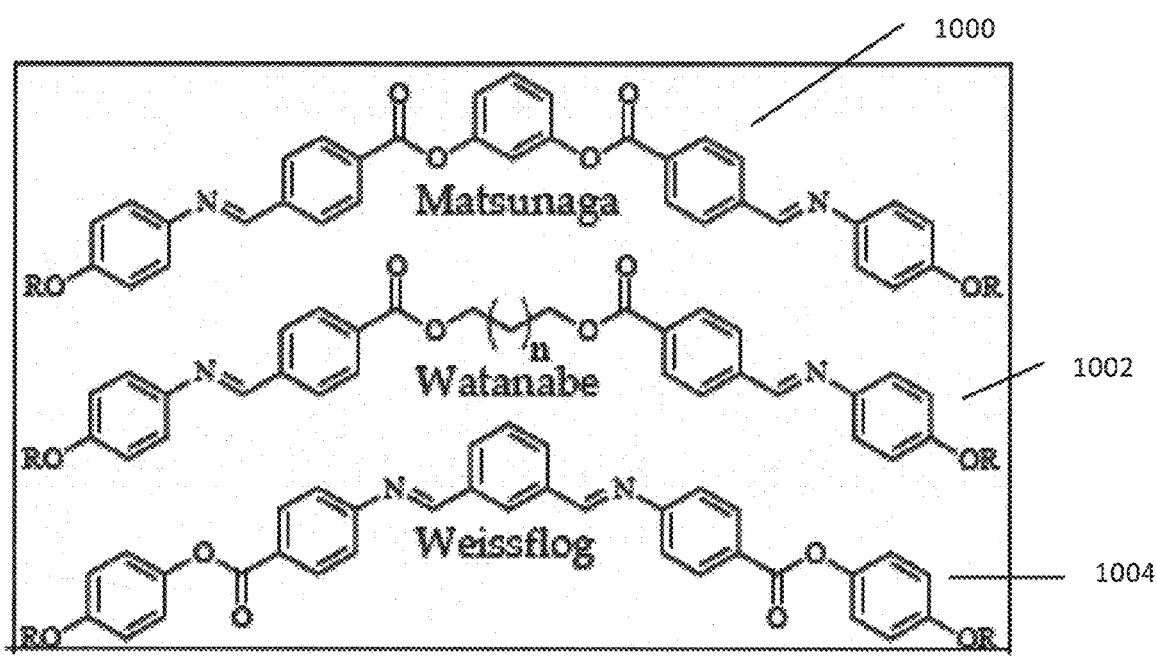
FIG. 10 shows additional classes of B4 phase mesogens that may be used according o the instrumentalities described hederin and, FIG. 11 shows an azobenzene molecule capable of demonstrating the B4 subphase.

FIG. 10 shows a comparison of known mesogens capable of forming the B4 phase. These include the Matsanuga class 1000, which is also referred to herein as NOBOW, The Watanabe class 1002 characterized by a separation of z carbons in the middle to enhance or reduce bending of the core, and the Weissflog class 1004. In all of these materials, R is $C_nH_{2n+1}$ were n suitably ranges from 7 to 18.

Figure 11:
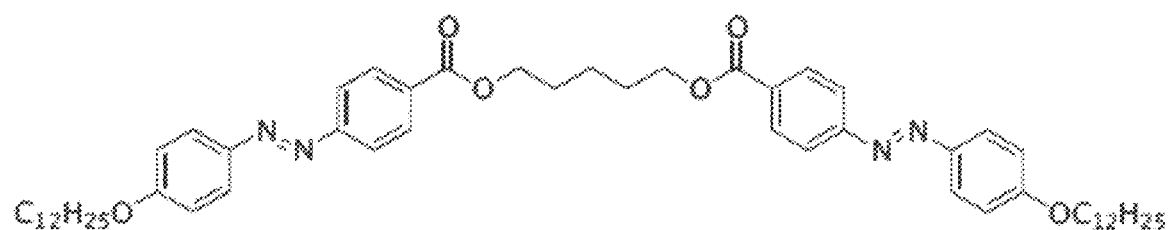

FIG. 11 shows an Azobenzene twin structure that is a visable dye demonstrating also the B4 phase. This molecule may also be used according to the instrumentalities described herein.

CONCLUSION

These results compare photo-induced electron transfer in a novel self-assembling ordered morphology, HNF, to a lamellar geometry. The HNF structure allows for significant enhancement of charge generation. We hypothesize that this is due to the distance between the electron acceptor and the electron-donating core of the P-9-OPIMB molecule. In the HNF phase, PCBM is in contact with the molecules core over around half of the structure. While in the lamellar phase, PCBM is only in contact with the tails of the molecule, which may be acting as an insulating layer. HNFs present a novel way to nano-phase separate donor and acceptor materials for organic photovoltaics. These results warrant further studies of HNF phase forming electron donors, which will be designed with specific photophysical and energetics in mind.

Although the present disclosure is described with respect to particular examples and preferred embodiments, it is understood that the present disclosure is not limited to these examples and embodiments. The present disclosure as claimed may therefore include variations from the particular examples and preferred embodiments described herein, as will be apparent to one of skill in the art.

BIBLIOGRAPHY

The following references report materials demonstrating the B4 phase and are hereby incorporated by reference to the same extent as though fully replicated herein.

1. Admiraal, S. J.; Herschlag, D. "The substrate-assisted general base catalysis model for phosphate monoester hydrolysis: Evaluation using reactivity comparisons," J. Am. Chem. Soc. 2000, 122, (10), 2145-2148.
2. Akutagawa, T.; Matsunaga, Y.; Yashuhara, K. Liq. Cryst. 1994, 17, 659-666.
3. Allen, M. P.; Warren, M. A.; Wilson, M. R. Phys. Rev. E 1998, 57, 5585-5596.
4. Araoka, F.; Ha, N.Y.; Kinoshita, Y.; Park, B.; Wu, J. W.; Takezoe, H. "Twist-grain-boundary structure in the B4 phase of a bent-core molecular system identified by second harmonic generation circular dichroism measurement," Phys. Rev. Lett. 2005, 94, (13).
5. Araoka, F.; Otani, T.; Ishikawa, K.; Takezoe, H. "Spectral blue shift via intermolecular interactions in the B2 and B4 phases of a bent-shaped molecule," Phys. Rev. E 2010, 82, (4).
6. Attard, G. S.; Date, R. W.; Imrie, C. T.; Luckhurst, G. R.; Roskilly, S. J.; Seddon, J. M.; Taylor, L. Liq. Cryst. 1994, 16, 529-581.
7. Bartolino, R.; Doucet, J.; Durand, G. Ann. Phys. (Paris) 1978, 3, 389-396.
8. Bergersen, B.; Boal, D.; Palffy-Muhoray, P. J. Phys. A: Math. Gen. 1994, 27, 2579-2586.
9. Bialecka-Florjanczyk, E.; Sledzinska, I.; Gorecka, E.; Przedmojski, J. "Odd-even effect in biphenyl-based symmetrical dimers with methylene spacer—evidence of the B4 phase," Liq. Cryst. 2008, 35, (4), 401-406.
10. Bialecka-Florjanczyk, E.; Sledzinska, I.; Gorecka, E.; Przedmojski, J. Liq. Cryst. 2008, 35, 401-406.
11. Brand, H. R.; Cladis, P. E.; Pleiner, H. Macromolecules 1992, 25, 7223-7226.
12. Brown et al, "Charge carrier generation and exciton quenching at M3EH-small molecule and M3EH-PPV/oxide interfaces," IEEE, (2000), pp. 1186-1189.
13. Chandani, A. D. L.; Gorecka, E.; Ouchi, Y.; Takezoe, H.; Fukuda, A. Jpn. J. Appl. Phys. 1989, 28, L1265-L1268.
14. Chen, D.; Zhu, C.; Shoemaker, R. K.; Korblova, E.; Walba, D. M.; Glaser, M. A.; Maclennan, J. E.; Clark, N. A. "Pre-transitional orientational ordering of calamitic by helical nanofilaments of bent-core liquid crystal," Langmuir 2010, 26, (19), 15541-15545.
15. Choi, S. W.; Kang, S. M.; Takanishi, Y.; Ishikawa, K.; Watanabe, J.; Takezoe, H. "Intrinsic chirality in a bent-core mesogen induced by extrinsic chiral structures," Angew. Chem. Int. Ed. 2006, 45, (39), 6503-6506.
16. Choi, S. W.; Kawauchi, S.; Tanaka, S.; Watanabe, J.; Takezoe, H. "Vibrational circular dichroism spectroscopic study on circularly polarized light-induced chiral domains in the B4 phase of a bent mesogen," Chemistry Letters 2007, 36, (8), 1018-1019.
17. Choi, S. W.; Kinoshita, Y.; Park, B.; Takezoe, H.; Niori, T.; Watanabe, J. "Second-harmonic generation in achiral bent-shaped liquid crystals," Jpn. J. Appl. Phys. Pt 1 1998, 37, (6A), 3408-3411.
18. Choi, S. W.; Zennyoji, M.; Takanishi, Y.; Takezoe, H.; Niori, T.; Watanabe, J. "Structure and switching in bent-shaped molecular liquid crystal systems with two mesogenic groups linked by alkylene spacer," Mol. Cryst. Liq. Cryst. Sci. Technol., Sect. A 1999, 328, 185-192.
19. Cladis, P. E.; Brand, H. R. Liq. Cryst. 1993, 14, 1327-1349.
20. Clark, N. A.; Lagerwall, S. T. Appl. Phys. Lett. 1980, 36, 899-901.
21. Coleman, D. A.; Jones, C. D.; Nakata, M.; Clark, N. A.; Walba, D. M.; Weissflog, W.; Fodor-Csorba, K.; Watanabe, J.; Novotna, V.; Hamplova, V. Phys. Rev. E 2008, 77, 021703.
22. Collings, P.; Heppke, G.; Krüerke, D.; Löhning, C.; Rabe, J.; Stocker, W., "Optical Investigation and Surface Imaging on the Banana "Blue-Phase"" in Abstracts, On Banana Liquid Crystals Chirality by Achiral Molecules, Technical University of Berlin, (1997), p 15.
23. Cotter, L. K.; Drabik, T. J.; Dillon, R. J.; Handschy, M. A. Opt. Lett. 1990, 15, 291-293.
24. Cram, D. J. Science 1988, 240, 760-767.
25. De Luca, G.; Liscio, A.; Melucci, M.; Schnitzler, T.; Pisula, W.; Clark, C. G.; Scolaro, L. M.; Palermo, V.; Mullen, K.; Samori, P. "Phase separation and affinity between a fluorinated perylene diimide dye and an alkyl-substituted hexa-peri-hexabenzocoronene," J. Mater. Chem. 2010, 20, (1), 71-82.
26. Demus, D.; Goodby, J.; Gray, G. W.; Spiess, H.-W.; Vill, V. Handbook of Liquid Crystals; Wiley VCH: Weinheim, 1998.
27. Drabik, T. J. In Thin Films for Integrated Optics Applications, Vol. 392. Wessels, B. W., Marder, S. R., Walba, D. M. (Eds.). Materials Research Society, San Francisco, 1995, pp. 111-122.
28. Drzaic, P. S. Liquid Crystal Dispersions. World Scientific, River Edge, N.J., 1995.
29. Ebert, M.; Herrmann-Schonherr, O.; Wendorff, J. H.; Ringsdorf, H.; Tschirner, P., Liq. Cryst. 1990, 7, 63-79.
30. Ewbank, P. C.; Laird, D.; McCullough, R. D., Regioregular Polythiophene Solar Cells: Material Properties and Performance. In Organic Photovoltaics: Materials, Device Physics, and Manufacturing Technologies; Brabec, C.; Dyakonov, V.; Scherf, U., Eds.; Wiley-VCH: Wien-hiem, 2008; pp 1-41.
31. Fering a, B. L.; Huck, N. P. M.; van Doren, H. A. J. Am. Chem. Soc. 1995, 117, 9929-9930.
32. Frommer, J. E. Acc. Chem. Res. 1986, 19, 2-9.
33. Funahashi, M.; Hanna, J. Appl. Phys. Lett. 1998, 73, 3733-3735.
34. Funahashi, M.; Hanna, J. Appl. Phys. Lett. 2000, 76, 2574-2576.
35. Funahashi, M.; Hanna, J. I. Adv. Mater. 2005, 17, 594-598.
36. Funahashi, M.; Hanna, J. Phys. Rev. Lett. 1997, 78, 2184-2187.
37. Glaser, M. A.; Ginzburg, V. V.; Clark, N. A.; Garcia, E.; Walba, D. M.; Malzbender, R. Molec. Phys. Rep. 1995, 10, 26-47.
38. Gregg, "Bilayer molecular solar cells in spin-coated TiO2 substrates," Chemical Physics Letters, vol. 258, (1996), pp. 376-370.
39. Gregg, "Excitonic Solar Cells," J. Phys. Chem. B, (2003), vol. 107, 4688-4698.
40. Gregg, B. A.; Fox, M. A.; Bard, A. J. "Photovoltaic effect in symmetrical cells of a liquid-crystal porphyrin," Journal of Physical Chemistry 1990, 94, (4), 1586-1598.
41. Heppke, G.; Jákli, A.; Krüerke, D.; Löhning, C.; Lötzsch, D.; Paus, S.; Rauch, S.; Sharma, N. K. In ECLC '97, Zakopane, Poland, 1997, p. 34.
42. Heppke, G.; Moro, D. "Chiral Order from Achiral Molecules," Science 1998, 279, (5358), 1872-1873.
43. Heppke, G.; Parghi, D. D.; Sawade, H. "Novel sulphur-containing banana-shaped liquid crystal molecules," Liq. Cryst. 2000, 27, (3), 313-320.
44. Heppke, G.; Parghi, D. D.; Sawade, H. In 7th International Conference on Ferroelectric Liquid Crystals; Darmstadt University of Technology, Germany, Darmstadt University of Technology, Germany, 1999; pp. 202-203 (Poster PC205).
45. Hough, L. E. M. Spannuth, M. Nakata, D. A. Coleman, C. D. Jones, G. Dantlgraber, C. Tschierske, J. Watanabe, E. Körblova, D. M. Walba, J. E. Maclennan, M. A. Glaser, and N. A. Clark, Chiral Isotropic Liquids from Achiral Molecules Science 24 Jul. 2009: 325 (5939), 452-456.
46. Hough, L. E. et. al., Science 24 Jul. 2009: 325 (5939), 456-460.
47. Hough, L. E.; Jung, H. T.; Krüerke, D.; Heberling, M. S.; Nakata, M.; Jones, C. D.; Chen, D.; Link, D. R.; Zasadzinski, J.; Heppke, G.; Rabe, J. P.; Stocker, W.; Korblova, E.; Walba, D. M.; Glaser, M. A.; Clark, N. A. "Helical nanofilament phases," Science 2009, 325, (5939), 456-460.
48. Hough, L. E.; Spannuth, M.; Jung, H. J.; Zasadzinski, J.; Kruerke, D.; Heppke, G.; Walba, D.; Clark, N. "Freeze Fracture and AFM Studies of the Liquid Crystal Dark Conglomerate and B4 Phases," Bull. Am. Phys. Soc. 2005, 50, 223.
49. Jákli, A.; Krüerke, D.; Sawade, H.; Heppke, G. Phys. Rev. Lett. 2001, 86, 5715-5718.
50. Jacobson, M. Z. Energy Environ. Sci. 2009, 2, 148-173.
51. Keith, C.; Reddy, R. A.; Hahn, H.; Lang, H.; Tschierske, C. "The carbosilane unit as a stable building block for liquid crystal design: a new class of ferroelectric switching banana-shaped mesogens," Chem. Commun. 2004, (17), 1898-1899.
52. Keller, E. N.; Nachaliel, E.; Davidov, D.; Buffel, C. Phys. Rev. A 1986, 34, 4363-4369.
53. Kossmehl, G.; Labahn, B. "Liquid crystalline compounds in the thiophene series 0.12. Synthesis and characterization of side chain polysiloxanes with low transition temperatures," Z Naturforsch B 1996, 51, (2), 286-294.
54. Kresse, H.; Schmalfuss, H.; Weissflog, W.; Tschierske, C.; Hauser, A. "Dielectric characterization of B-n phases," Mol. Cryst. Liquid Cryst. 2001, 366, 2357-2369.
55. Kuboshita, M.; Matsunaga, Y.; Miyauchi, T. Mol. Cryst. Liq. Cryst. A 1995, 264, 145-153.
56. Kurosu, H.; Kawasaki, M.; Hirose, M.; Yamada, M.; Kang, S.; Thisayukta, J.; Sone, M.; Takezoe, H.; Watanabe, J. "Solid-State 13C NMR Study of Chiral Twisted Conformation Attributable to Chirality in Smectic Phases of Achiral Banana-Shaped Molecules," J. Phys. Chem. A 2004, 108, (21), 4674-4678.
57. L. M.; Haase, W. Chem. Phys. Lett. 1996, 260, 447-452.
58. Lee, C. K.; Chien, L. C. Liq. Cryst. 1999, 26, 609-612.
59. Lee, S. K.; Heo, S.; Lee, J. G.; Kang, K. T.; Kumazawa, K.; Nishida, K.; Shimbo, Y.; Takanishi, Y.; Watanabe, J.; Doi, T.; Takahashi, T.; Takezoe, H. "Odd-even behavior of ferroelectricity and antiferroelectricity in two homologous series of bent-core mesogens," J. Am. Chem. Soc. 2005, 127, (31), 11085-11091.
60. Lee, S. K.; Li, X. D.; Kang, S. M.; Tokita, M.; Watanabe, J. "Formation of banana phases in bent-shaped molecules with unusual bent angles as low as 60 degrees," J. Mater. Chem. 2009, 19, (26), 4517-4522.
61. Lehn, J. M. Angew. Chem., Int. Ed. Engl. 1990, 29, 1304-1319.
62. Lemieux, R. P. Acc. Chem. Res. 2001, 341, 845-853.
63. Li, X. D.; Kang, S. M.; Lee, S. K.; Tokita, M.; Watanabe, J. "Unusual Formation of Switchable Hexagonal Columnar Phase by Bent-Shaped Molecules with Low Bent-Angle Naphthalene Central Core and Alkylthio Tail," Jpn. J. Appl. Phys. 2010, 49, (12).
64. Link, D. R.; Clark, N. A.; Ostrovskii, B. I.; Soto Bustamante, E. A. Phys. Rev. E 2000, 61, R37-R40.
65. Link, D. R.; Maclennan, J. E.; Clark, N. A. Phys. Rev. Lett. 1996, 77, 2237-2240.
66. Link, D. R.; Natale, G.; Maclennan, J. E.; Clark, N. A.; Walsh, M.; Keast, S. S.; Neubert, M. E. Phys. Rev. Lett. 1999, 83, 3665-3668.
67. Link, D. R.; Natale, G.; Shao, R.; Maclennan, J. E.; Clark, N. A.; Korblova, E.; Walba, D. M. Science 1997, 278, 1924-1927.
68. Lischka, C.; Weissflog, W. In ECLC '97, Zakopane, Poland, 1997, p. 201.
69. Maiti, P. K.; Lansac, Y.; Glaser, M. A.; Clark, N. A. Ordering of Bent-Core Molecules in a Smectic Solvent; Abstracts of the 8th International Conference on Ferroelectric Liquid Crystals, Washington, D.C., 2001, p. 48.
70. Malenfant, P. R. L.; Dimitrakopoulos, C. D.; Gelorme, J. D.; Kosbar, L. L.; Graham, T. O.; Curioni, A.; Andreoni, W. Appl. Phys. Lett. 2002, 80, 2517-2519.
71. Martinez-Perdiguero, J.; Alonso, I.; Folcia, C. L.; Etxebarria, J.; Ortega, J. "Local structure of the B-4 phase studied by second harmonic generation and X-ray diffraction measurements," J. Mater. Chem. 2009, 19, (29), 5161-5166.
72. Matsumoto, E. A.; Alexander, G. P.; Kamien, R. D. "Helical Nanofilaments and the High Chirality Limit of Smectics A," Phys. Rev. Lett. 2009, 103, (25).

73. Matsumoto, S.; Takanishi, Y.; Choi, S.-W.; Ishikawa, K.; Watanabe, J.; Kishikawa, K.; Takezoe, H. "Does the tilted B4 phase exist," Abstracts of the 11th International Ferroelectric Liquid Crystal Conference 2007, O-21, 34.
74. Mauguin, C. B. Soc. Franc. Miner. 1911, 34, 71.
75. McCulloch, 1.; Heeney, M.; Bailey, C.; Genevicius, K.; Macdonald, I.; Shkunov, M.; Spar-rowe, D.; Tierney, S.; Wagner, R.; Zhang, W. M.; Chabinyc, M. L.; Kline, R. J.; McGehee, M. D.; Toney, M. F. "Liquid-crystalline semiconducting polymers with high charge-carrier mobility," Nature Materials 2006, 5, (4), 328-333.
76. Meyer, R. B. In abstracts of the 5th International Liquid Crystal Conference: Stockholm, Sweden, 1974, p. 115.
77. Meyer, R. B.; Liebert, L.; Strzelecki, L.; Keller, P. J. Phys., Lett. (Orsay, Fr.) 1975, 36, L69-L71.
78. Miles, R. W.; Zoppi, G.; Forbes, I. Mater. Today 2007, 10, 20-27.
79. Miyachi, K.; Matsushima, J.; Takanishi, Y.; Ishikawa, K.; Takezoe, H.; Fukuda, A. Phys. Rev. E: Stat. Phys., Plasmas, Fluids, Relat. Interdiscip. Top. 1995, 52, R2153-R2156.
80. Miyake, I.; Takanishi, Y.; Rao, N. V. S.; Paul, M. K.; Ishikawa, K.; Takezoe, H. "Novel chiral filament in an achiral W-shaped liquid crystalline compound," J. Mater. Chem. 2005, 15, (44), 4688-4694.
81. Morales-Saavedra, O. G.; Bulat, M.; Rauch, S.; Heppke, G. "Domain structure studies in phases of bent-shaped molecules by spatially resolved second harmonic microscopy," Mol. Cryst. Liquid Cryst. 2004, 413, 2743-2752.
82. Morales-Saavedra, O. G.; Castaneda, R.; Ocotlan-Flores, J.; Roman-Moreno, C.; Ortega-Martinez, R.; Pelzl, G. "Chlorine-substituted bent-core LC-based sono-gel hybrid materials: Synthesis and optical properties," Mol. Cryst. Liquid Cryst. 2008, 488, 56-73.
83. Morales-Saavedra, O. G.; Jakli, A.; Heppke, G.; Eichler, H. J. "Polar micro structures of the B-2- and B-4-phases of bent-shaped LC-molecules resolved by nonlinear optical microscopy," Journal of Nonlinear Optical Physics & Materials 2006, 15, (2), 287-302.
84. Morales-Saavedra, O. G.; Jakli, A.; Heppke, G.; Eichler, H. J. "Polar ordering in thermotropic mesogens resolved by scanning NLO microscopy," Journal of Nonlinear Optical Physics & Materials 2006, 15, (4), 431-446.
85. Nadasi, H.; Lischka, C.; Weissflog, W.; Wirth, I.; Diele, S.; Pelzl, G.; Kresse, H. "B-2-B-4 dimorphism in a new series of banana-shaped mesogens," Mol. Cryst. Liquid Cryst. 2003, 399, 69-84.
86. Nakata, M.; Link, D. R.; Araoka, F.; Thisayukta, J.; Takanishi, Y.; Ishikawa, K.; Watanabe, J.; Takezoe, H. Liq. Cryst. 2001, 28, 1301-1308.
87. Niori, T.; Sekine, T.; Watanabe, J.; Furukawa, T.; Takezoe, H. "Distinct ferroelectric smectic liquid crystals consisting of achiral molecules with banana shape," Mol. Cryst. Liq. Cryst. Sci. Technol., Sect. A 1997, 301, 337-&.
88. Niori, T.; Sekine, T.; Watanabe, J.; Furukawa, T.; Takezoe, H. Abstracts of the 16th International Liquid Crystal Conference, Kent, Ohio, 1996; p 126.
89. Niori, T.; Sekine, T.; Watanabe, J.; Furukawa, T.; Takezoe, H. Distinct Ferroelectric Smectic Liquid Crystals Consisting of Achiral Molecules with Banana Shape; Abstracts of the 16th International Liquid Crystal Conference, Kent State University, Kent, Ohio, 1996, p. 126.
90. Niori, T.; Sekine, T.; Watanabe, J.; Furukawa, T.; Takezoe, H. J. Mater. Chem. 1996, 6, 1231-1233.
91. Niori, T.; Sekine, T.; Watanabe, J.; Furukawa, T.; Takezoe, H., "Distinct ferroelectric smectic liquid crystals consisting of achiral molecules with banana shape" in Abstracts, 16th International Liquid Crystal Conference, Kent State University, Kent, Ohio, USA, (1996), p 126.
92. Niwano, H.; Nakata, M.; Thisayukta, J.; Link, D. R.; Takezoe, H.; Watanabe, J. "Chiral Memory on Transition between the B2 and B4 Phases in an Achiral Banana-Shaped Molecular System," J. Phys. Chem. B 2004, 108, (39), 14889-14896.
93. O'Donnell, P.; Doi, A. Information Display 2001, 17, 16-19.
94. Ortega, J.; Pereda, N.; Folcia, C. L.; Etxebarria, J.; Ros, M. B. "Second-harmonic generation studies in the B-2 and B-4 phases of a banana-shaped liquid crystal," Phys. Rev. E 2001, 63, (1), 011702.
95. Ostrovskii, B. I.; Soto Bustamante, E. A.; Sulianov, S, N.; Galyametdinov, Y. G.; Haase, W. H. Mol. Cryst. Liq. Cryst. Sci. Technol., Sect. C 1996, 6, 171-188.
96. Otani, T.; Araoka, F.; Ishikawa, K.; Takezoe, H. "Enhanced Optical Activity by Achiral Rod-Like Molecules Nano segregated in the B-4 Structure of Achiral Bent-Core Molecules," J. Am. Chem. Soc. 2009, 131, (34), 12368-12372.
97. Otowski, W.; Budziak, A.; Dobrowolska, A. "Dielectric and XRD Investigation of Ferroelectric Liquid Crystal Composed of Banana-Shaped Achiral Molecules," Mol. Cryst. Liquid Cryst. 2008, 494, 11-20.
98. Pelzl, G.; Diele, S.; Jákli, A.; Lischka, C.; Wirth, I.; Weissflog, W. Liq. Cryst. 1999, 26, 135-139.
99. Pelzl, G.; Diele, S.; Weissflog, W. "Banana-shaped compounds—A new field of liquid crystals," Adv. Mater. 1999, 11, (9), 707-724.
100. Pelzl, G.; Diele, S.; Weissflog, W. Adv. Mater. 1999, 11, 707-724.
101. Pelzl, G.; Wirth, I.; Weissflog, W. Liq. Cryst. 2001, 28, 969-972.
102. Photinos, D. J.; Samulski, E. T. Science 1995, 270, 783-786.
103. Pindak, R.; Young, C. Y.; Meyer, R. B.; Clark, N. A. Phys. Rev. Lett. 1980, 45, 1193-1196.
104. Pisula, W.; Zorn, M.; Chang, J. Y.; Mullen, K. Macromol. Rapid Commun. 2009, 30, 1179-1202.
105. Prasad, V. "Bent-core mesogens with biphenyl moieties: observation of a B-7 to B-4 phase transition," Liq. Cryst. 2001, 28, (7), 1115-1120.
106. Rastegar, A.; Wulterkens, G.; Verscharen, H.; Rasing a, T.; Heppke, G. Rev. Sci. Instrum. 2000, 71, 4492-4496.
107. Reddinger, J. L.; Reynolds, J. R. Adv. Poly. Sci. 1999, 145, 57-122.
108. Renn, S. R.; Lubensky, T. C. Phys. Rev. A 1988, 38, 2132-2147.
109. Rudquist, P.; Körblova, E.; Walba, D. M.; Shao, R.-F.; Clark, N. A.; Maclennan, J. E. Liq. Cryst. 1999, 26, 1555-1561.
110. Salfetnikova, J.; Schmalfuss, H.; Nadasi, H.; Weissflog, W.; Kresse, H. "Dielectric characterization of B-3 and B-4 phases," Liq. Cryst. 2000, 27, (12), 1663-1667.
111. Sekine, T.; Niori, T.; Sone, M.; Watanabe, J.; Choi, S.-W.; Takanishi, Y.; Takezoe, H. Jpn. J. Appl. Phys. 1997, 36, 6455-6463.
112. Sekine, T.; Niori, T.; Sone, M.; Watanabe, J.; Choi, S.-W.; Takanishi, Y.; Takezoe, H. "Origin of Helix in Achiral Banana-Shaped Molecular Systems," Jpn. J. Appl. Phys. 1997, 36, 6455-6463.

113. Sekine, T.; Niori, T.; Watanabe, J.; Furukawa, T.; Choi, S. W.; Takezoe, H. "Spontaneous helix formation in smectic liquid crystals comprising achiral molecules," J. Mater. Chem. 1997, 7, (8), 1307-1309.

114. Sekine, T.; Niori, T.; Watanabe, J.; Furukawa, T.; Choi, S. W.; Takezoe, H. J. Mater. Chem. 1997, 7, 1307-1309.

115. Sekine, T.; Takanishi, Y.; Niori, T.; Watanabe, J.; Takezoe, H. Jpn. J. Appl. Phys. 1997, 36, L1201-L1203.

116. Shen, D.; Pegenau, A.; Diele, S.; Wirth, I.; Tschierske, C. J. Am. Chem. Soc. 2000, 1593-1601, 122.

117. Shiromo, K.; Sahade, D. A.; Oda, T.; Nihira, T.; Takanishi, Y.; Ishikawa, K.; Takezoe, H. "Finite enantiomeric excess nucleated in an achiral banana mesogen by chiral alignment surfaces," Angew. Chem. Int. Ed. 2005, 44, (13), 1948-1951.

118. Shockley, W.; Queisser, H. J. J. Appl. Phys. 1961, 32, 510-519.

119. Sirringhaus, H.; Brown, P. J.; Friend, R. H.; Nielsen, M. M.; Bechgaard, K.; Langeveld-Voss, B. M. W.; Spiering, A. J. H.; Janssen, R. A. J.; Meijer, E. W.; Herwig, P.; de Leeuw, D. M. Nature 1999, 401, 685-688.

120. Soto Bustamante, E. A.; Yablonskii, S. V.; Ostrovskii, B. I.; Beresnev, L. A.; Blinov, L. M.; Haase, W. Liq. Cryst. 1996, 21, 829-839.

121. Stevens, F.; Dyer, D. J.; Walba, D. M. Angew. Chem., Int. Ed. Engl. 1996, 35, 900-901.

122. Svoboda, J.; Novotna, V.; Kozmik, V.; Glogarova, M.; Weissflog, W.; Diele, S.; Pelzl, G. "A novel type of banana liquid crystals based on 1-substituted naphthalene-2,7-diol cores," J. Mater. Chem. 2003, 13, (9), 2104-2110.

123. Szydlowska, J.; Mieczkowski, J.; Matraszek, J.; Bruce, D. W.; Gorecka, E.; Pociecha, D.; Guillon, D. Phys. Rev. E 2003, 67, 031702.

124. Takanishi, Y.; Shin, G. J.; Jung, J. C.; Choi, S. W.; Ishikawa, K.; Watanabe, J.; Takezoe, H.; Toledano, P. "Observation of very large chiral domains in a liquid crystal phase formed by mixtures of achiral bent-core and rod molecules," J. Mater. Chem. 2005, 15, (37), 4020-4024.

125. Takekoshi, K.; Ema, K.; Yao, H.; Takanishi, Y.; Watanabe, J.; Takezoe, H. "Appearance of a liquid crystalline nematic-isotropic critical point in a mixture system of rod- and bent-shaped molecules," Phys. Rev. Lett. 2006, 97, (19).

126. Tenneti, K. K.; Chen, X. F.; Li, C. Y.; Wan, X. H.; Fan, X. H.; Zhou, Q. F.; Rong, L. X.; Hsiao, B. S. "Hierarchical nanostructures of bent-core molecules blended with poly(styrene-b-4-vinylpyridine) block copolymer," Macromolecules 2007, 40, (14), 5095-5102.

127. Thisayukta, J.; Takezoe, H.; Watanabe, J. "Study on Helical Structure of the B4 Phase Formed from Achiral Banana-Shaped Molecule," Jpn. J. Appl. Phys. 2001, 40, (Part 1, No. 5A), 3277-3287.

128. Thisayukta, J.; Takezoe, H.; Watanabe, J. Jpn. J. Appl. Phys. 2001, 40, 3277-3287.

129. Tian, H.; Shi, J.; He, B.; Hu, N.; Dong, S.; Yan, D.; Zhang, J.; Geng, Y.; Wang, F. Adv. Funct. Mater. 2007, 17, 1940-1951.

130. Tierney, S.; Heeney, M.; McCulloch, I. Synthetic Met. 2005, 148, 195-198.

131. Tsai, E. Design and Synthesis of Novel Bent-Core Liquid Crystals (Thesis); University of Colorado: Boulder, Colo., 2006.

132. Tsai, E.; Richardson, J. M.; Walba, D. M.; Clark, N. A. Science. To be submitted for publication.

133. Tsuzuki et al, "Photoelectrical conversion of p-n heterojunction devices using thin films of titanyl phthalocyanine and a perylene pigment," Thin Solid Films, vol. 273, (1996), 177-180. cited by examiner.

134. Van Breemen, A. J. J. M.; Herwig, P. T.; Chlon, C. H. T.; Sweelssen, J.; Schoo, H. F., M.; Setayesh, S.; Hardeman, W. M.; Martin, C. A.; de Leeuw, D. M.; Valeton, J. J. Chem. Soc. 2006, 128, 2336-2345.

135. Viswanathan, R.; Zasadzinski, J. A.; Schwartz, D. K. Nature 1994, 368, 440-443.

136. Eckhardt, C. J.; Peachey, N. M.; Swanson, D. R.; Takacs, J. M.; Khan, M. A.; Gong, X.; Kim, J.-H.; Wang, J.; Uphaus, R. A. Nature 1993, 362, 614-616. (d) Nassoy, P.; Goldmann, M.; Bouloussa, O.; Rondelez, F. Phys. Rev. Lett. 1995, 75, 457-460. (e) Weissbuch, I.; Berfeld, M.; Bouwman, W.; Kjar, K.; Als-Nielsen, J.; Lahav, M.; Leiserowitz, L. J. Am. Chem. Soc. 1997, 119, 933-942.

137. Vizitiu, D.; Lazar, C.; Radke, J. P.; Hartley, C. S.; Glaser, M. A.; Lemieux, R. P. Chem. Mater. 2001, 13, 1692-1699.

138. Voländer, D.; Apel, A.; Galka, W. Ber. 1932, 1101-1109.

139. Vorlander, D.; Apel, A.; Galka, W. Chem. Ber. 1932, 1101-1109.

140. Walba, D. M. et. al, Crystal Growth & Design, Vol. 5, No. 6, 2005, pp. 2091-2099.

141. Walba, D. M. In Advances in the Synthesis and Reactivity of Solids, Vol. 1. Mallouk, T. E. (Ed.). JAI, Greenwich, Conn., 1991, pp. 173-235.

142. Walba, D. M. In Topics in Stereochemistry, Materials-Chirality; Green, M. M., Nolte, R. J. M., Meijer, E. W., Denmark, S. E., Eds.; Wiley: New York, 2003; Vol. 24, pp 457-518.

143. Walba, D. M. Tetrahedron 1985, 41, 3161-3212.

144. Walba, D. M.; Eshdat, L.; Körblova, E.; Shoemaker, R. K. "On the nature of the B4 banana phase: Crystal or not a crystal?," Cryst. Growth Des. 2005, 5, (6), 2091-2099.

145. Walba, D. M.; Eshdat, L.; Korblova, E.; Shoemaker, R. K. "On the nature of the B4 banana phase: Crystal or not a crystal?," Cryst. Growth Des. 2005, 5, (6), 2091-2099.

146. Walba, D. M.; Körblova, E.; Shao, R.-F.; Maclennan, J. E.; Link, D. R.; Clark, N. A. In Liquid Crystal Materials and Devices, Vol. 559. Bunning, T., Chen, S., Chien, L.-C., Kajiyama, T., Koide, N., Lien, S.-C. (Eds.). Materials Research Society, San Francisco, 1999, pp. 3-14.

147. Walba, D. M.; Körblova, E.; Shao, R.-F.; Maclennan, J. E.; Link, D. R.; Clark, N. A., 518 FERROELECTRIC LIQUID CRYSTAL CONGLOMERATES In IDW '98: Fifth International Display Workshops, SID Japan Chapter, Kobe, Japan, 1998, pp. 97-100.

148. Walba, D. M.; Körblova, E.; Shao, R.-F.; Maclennan, J. E.; Link, D. R.; Glaser, M. A.; Clark, N. A. J. Phys. Org. Chem. 2000, 12, 830-836.

149. Walba, D. M.; Körblova, E.; Shao, R.-F.; Maclennan, J. E.; Link, D. R.; Glaser, M. A.; Clark, N. A. Science 2000, 288, 2181-2184.

150. Walba, D. M.; Korblova, E.; Shao, R.-F.; Coleman, D. N.; Chattham, N.; Clark, N. A. A Bow-Phase Liquid Crystal Exhibiting a General Smectic C Phase; Abstracts of the 8th International Conference on Ferroelectric Liquid Crystals, Washington, D.C., 2001, p. 29.

151. Walba, D. M.; Slater, S. C.; Thurmes, W. N.; Clark, N. A.; Handschy, M. A.; Supon, F., J. Am. Chem. Soc. 1986, 108, 5210-5221.

152. Walba, D. M.; Stevens, F.; Clark, N. A.; Parks, D. C. Acc. Chem. Res. 1996, 29, 591-597.
153. Wasserman, E. J. Am. Chem. Soc. 1960, 82, 4433-4434.
154. Wasserman, E. Sci. Am. 1962, 207, 94-100.
155. Watanabe, J.; Hayashi, M. Macromolecules 1989, 22, 4083-4088.
156. Watanabe, J.; Komura, H.; Niori, T. Liq. Cryst. 1993, 13, 455-465.
157. Watanabe, J.; Niori, T.; Sekine, T.; Takezoe, H. "Frustrated Structure induced on ferroelectric smectic phases in banana-shaped molecular system," Jpn. J. Appl. Phys. 1998, 37, L139-L142.
158. Weinan, E.; Palffy-Muhoray, P. J. Nonlinear Sci. 1999, 9, 417-437.
159. Weis, R. M.; McConnell, H. M. Nature 1984, 310, 47-49.
160. Weissflog, W.; Lischka, C.; Benné, I.; Scharf, T.; Pelzl, G.; Diele, S.; Kruth, H. "New banana-shaped mesogens," Proc. SPIE-Int. Soc. Opt. Eng. 1998, 3319, 14-19.
161. Weissflog, W.; Nádasi, H.; Dunemann, U.; Pelzl, G.; Diele, S.; Eremin, A.; Kresse, H. J. Mater. Chem. 2001, 11, 2748-2758.
162. Yamaguchi, A.; Nishiyama, I.; Yamamoto, J.; Yokoyama, H.; Yoshizawa, A., "Unusual smectic phases organized by novel lambda-shaped mesogenic molecules," J. Mater. Chem. 2005, 15, (2), 280-288.
163. Yamazaki, Y.; Takanishi, Y.; Yamamoto, J. "Dynamic heterogeneity of a nano structure in the hyper-swollen B4 phase of achiral bent-core molecules diluted with rod-like liquid crystals," Epl 2009, 88, (5).
164. Young, C. Y.; Pindak, R.; Clark, N. A.; Meyer, R. B. Phys. Rev. Lett. 1978, 40, 773-776.
165. Yuen, J. D.; Menon, R.; Coates, N. E.; Namdas, E. B.; Cho, S.; Harmahs, S. T.; Moses, D.; Hee-ger, A. J. "Nonlinear transport in semiconducting polymers at high carrier densities," Nature Materials 2009, 8, (7), 572-575.
166. Zeng, W. J.; Chong, K. S. L.; Low, H. Y.; Williams, E. L.; Tam, T. L.; Sellinger, A. "The use of nanoimprint lithography to improve efficiencies of bilayer organic solar cells based on P3HT and a small molecule acceptor," Thin Solid Films 2009, 517, (24), 6833-6836.
167. Zhang, Y.; Schuster, G. B. J. Org. Chem. 1994, 59, 1855-1862.
168. Zhu, C.; Chen, D.; Shen, Y.; Jones, C. D.; Glaser, M. A.; Maclennan, J. E.; Clark, N. A. "Nanophase segregation in binary mixtures of a bent-core and a rodlike liquid-crystal molecule," Phys. Rev. E 2010, 81, (011704), 011704-1-011704-5.

U.S. Patents
1. U.S. Pat. No. 4,278,474 Device for conversion of electromagnetic radiation into electrical current Jul. 14, 1981
2. U.S. Pat. No. 4,316,049 High voltage series connected tandem junction solar battery Feb. 16, 1982
3. U.S. Pat. No. 4,479,028 Amorphous solar cell Oct. 23, 1984
4. U.S. Pat. No. 4,771,321 High conductance ohmic junction for monolithic semiconductor devices Sep. 13, 1988
5. U.S. Pat. No. 4,789,436 Method and apparatus for nondestructive in vivo measurement of photosynthesis Dec. 6, 1988
6. U.S. Pat. No. 4,963,196 Organic solar cell Oct. 16, 1990
7. U.S. Pat. No. 5,104,749 Organic electroluminescent device Apr. 14, 1992
8. U.S. Pat. No. 5,315,129 Organic optoelectronic devices and methods May 24, 1994
9. U.S. Pat. No. 5,350,644 Photovoltaic cells Sep. 27, 1994
10. U.S. Pat. No. 5,456,762 Photoelectric conversion elements Oct. 10, 1995
11. U.S. Pat. No. 5,527,716 Method of making integrated-circuit stacked-cell solar module Jun. 18, 1996
12. U.S. Pat. No. 5,703,436 Transparent contacts for organic devices Dec. 30, 1997
13. U.S. Pat. No. 5,837,391 Organic electroluminescent element having electrode between two fluorescent media for injecting carrier thereinto Nov. 17, 1998
14. U.S. Pat. No. 5,844,363 Vacuum deposited, non-polymeric flexible organic light emitting devices Dec. 1, 1998
15. U.S. Pat. No. 5,854,139 Organic field-effect transistor and production thereof Dec. 29, 1998
16. U.S. Pat. No. 5,917,279 Intermediate layer in electroluminescent arrangements containing finely divided inorganic particles Jun. 29, 1999
17. U.S. Pat. No. 5,986,206 Solar cell Nov. 16, 1999
18. U.S. Pat. No. 6,049,090 Semiconductor particle electroluminescent display Apr. 11, 2000
19. U.S. Pat. No. 6,097,147 Structure for high efficiency electroluminescent device Aug. 1, 2000
20. U.S. Pat. No. 6,174,613 Method and apparatus for fabricating polymer-based electroluminescent displays Jan. 16, 2001
21. U.S. Pat. No. 6,198,091 Stacked organic photosensitive optoelectronic devices with a mixed electrical configuration Mar. 6, 2001
22. U.S. Pat. No. 6,198,092 Stacked organic photosensitive optoelectronic devices with an electrically parallel configuration Mar. 6, 2001
23. U.S. Pat. No. 6,278,055 Stacked organic photosensitive optoelectronic devices with an electrically series configuration Aug. 21, 2001
24. U.S. Pat. No. 6,297,495 Organic photosensitive optoelectronic devices with a top transparent electrode Oct. 2, 2001
25. U.S. Pat. No. 6,333,458 Highly efficient multiple reflection photosensitive optoelectronic device with optical concentrator Dec. 25, 2001
26. U.S. Pat. No. 6,352,777 Organic photosensitive optoelectronic devices with transparent electrodes Mar. 5, 2002
27. U.S. Pat. No. 6,420,031 Highly transparent non-metallic cathodes Jul. 16, 2002
28. U.S. Pat. No. 6,433,359 Surface modifying layers for organic thin film transistors Aug. 13, 2002
29. U.S. Pat. No. 6,451,415 Organic photosensitive optoelectronic device with an exciton blocking layer Sep. 17, 2002
30. U.S. Pat. No. 6,468,819 Method for patterning organic thin film devices using a die Oct. 22, 2002
31. U.S. Pat. No. 6,580,027 Solar cells using fullerenes Jun. 17, 2003
32. U.S. Pat. No. 6,657,378 Organic photovoltaic devices Dec. 2, 2003
33. U.S. Pat. No. 6,692,820 Organic photosensitive optoelectronic device with a charge blocking layer Feb. 17, 2004
34. U.S. Pat. No. 6,774,300 Apparatus and method for photovoltaic energy production based on internal charge emission in a solid-state heterostructure Aug. 10, 2004

35. U.S. Pat. No. 7,157,641 Organic photovoltaic cells with an electric field integrally-formed at the heterojunction interface Jan. 2, 2007

36. U.S. Pat. No. 7,601,910 Organic photovoltaic devices Oct. 13, 2009

What is claimed is:

1. In an electrical device that incorporates an organic semiconductor material, the improvement comprising:
the organic semiconductor material including an organic crystal made of mesogens in the B4 phase.

2. The device of claim 1, wherein the organic semiconductor material forms a heterojunction with a second organic material.

3. Then device of claim 1, wherein the second organic material is a fullerene.

4. The device of claim 1, wherein the device is an organo photoelectric cell.

5. The device of claim 1, wherein the device is an organic field effect transistor.

6. The device of claim 1, wherein the mesogens of the organic crystal include molecules selected from the group consisting of NOBOW molecules and W513 molecules.

7. The device of claim 1, wherein the mesogens of the organic crystal include comprise a p-type semiconductor.

8. The device of claim 1, wherein the mesogens of the organic crystal are swelled with a solution containing an acceptor.

9. The device of claim 8 wherein the acceptor comprises a n-type semiconductor.

10. The device of claim 8 wherein the acceptor is a fullerene.

11. The device of claim 9 wherein said bent-core molecules in said liquid crystalline phase comprise a p-type semiconductor and are in contact with said n-type semiconductor, said contact comprising a p-n type heterojunction.

12. The device of claim 1 wherein said bent-core molecules are coated with a solution containing an acceptor.

13. The device of claim 12 wherein the acceptor comprises an n-type semiconductor.

14. The device of claim 12 wherein said acceptor is a fullerene.

15. The device of claim 13 wherein said bent-core molecules comprise a p-type semiconductor and are in contact with said n-type semiconductor, said contact comprising a p-n type heterojunction.

16. The device of claim 1 wherein said bent-core molecules are chemically bound to an acceptor at each first end and at each second end of said bent-core molecules.

17. The device of claim 16 comprising a n-type semiconductor.

18. The device of claim 12 wherein said acceptor is a fullerene.

19. The device of claim 17 wherein said bent-core molecules in said liquid crystalline phase comprise a p-type semiconductor and are in contact with said n-type semiconductor, said contact comprising a p-n type heterojunction.

* * * * *

UNITED STATES PATENT AND TRADEMARK OFFICE
CERTIFICATE OF CORRECTION

PATENT NO. : 8,963,140 B2  Page 1 of 1
APPLICATION NO. : 13/764660
DATED : February 24, 2015
INVENTOR(S) : David Walba It is certified that error appears in the above-identified patent and that said Letters Patent is hereby corrected as shown below:

Title, Page 1, Column 1, Item (54), "Organic Photovotaics" should read -- Organic Photovoltaics --.

Signed and Sealed this
Sixth Day of October, 2015

Michelle K. Lee
*Director of the United States Patent and Trademark Office*